United States Patent
Chung

(10) Patent No.: US 9,882,322 B2
(45) Date of Patent: Jan. 30, 2018

(54) CONNECTOR AND ELECTRONIC DEVICE INCLUDING THE SAME

(71) Applicant: Samsung Electronics Co., Ltd., Suwon-si, Gyeonggi-do (KR)

(72) Inventor: Cheol-Yoon Chung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/416,750

(22) Filed: Jan. 26, 2017

(65) Prior Publication Data

US 2017/0358895 A1    Dec. 14, 2017

(30) Foreign Application Priority Data

Jun. 8, 2016 (KR) .................. 10-2016-0071060

(51) Int. Cl.
*H01R 24/60* (2011.01)
*H01R 13/627* (2006.01)
*H01R 13/6594* (2011.01)
*H05K 5/00* (2006.01)

(52) U.S. Cl.
CPC ......... *H01R 24/60* (2013.01); *H01R 13/6272* (2013.01); *H01R 13/6594* (2013.01); *H05K 5/0069* (2013.01)

(58) Field of Classification Search
CPC ........................... H01R 2107/00; H01R 24/60
See application file for complete search history.

(56) References Cited

U.S. PATENT DOCUMENTS

| 9,281,642 B1* | 3/2016 | Tseng .................... H01R 24/60 |
| 9,450,341 B2* | 9/2016 | Kao .................. H01R 13/6585 |
| 2015/0244111 A1 | 8/2015 | Ju et al. |

OTHER PUBLICATIONS https://en.wikipedia.org/wiki/USB-C. retrieved Jun. 13, 2017.*

* cited by examiner

*Primary Examiner* — Ross Gushi
(74) *Attorney, Agent, or Firm* — Jefferson IP Law, LLP

(57) ABSTRACT

An electronic device is provided. The electric device includes a receptacle configured to be connected with an external connector, and a ground member and a control circuit that are electrically connected to the receptacle. The receptacle includes a shell configured to accommodate the external connector, a tongue disposed in a space of the shell and enclosed by the shell, at least one first contact disposed on the tongue and electrically connected to the ground member, at least one second contact disposed on the tongue and electrically connected to the control circuit, and at least one third contact that is formed of at least a portion of a conductive member included in the tongue and electrically connected to the control circuit. The first contact may have a length further extending over the third contact in a direction where the external connector is separated from the receptacle.

19 Claims, 24 Drawing Sheets

| C1 | A1 | A2 | A3 | A4 | A5 | A6 | A7 | A8 | A9 | A10 | A11 | A12 | C2 |
|---|---|---|---|---|---|---|---|---|---|---|---|---|---|
|  | GND | TX1+ | TX1- | VBUS | CC1 | D+ | D- | SBU1 | VBUS | RX2- | RX2+ | GND |  |
|  | GND | RX1+ | RX1- | VBUS | SBU2 | D- | D+ | CC2 | VBUS | TX2- | TX2+ | GND |  |
|  | B12 | B11 | B10 | B9 | B8 | B7 | B6 | B5 | B4 | B3 | B2 | B1 |  |

FIG.10

| C1 | A12 | A11 | A10 | A9 | A8 | A7 | A6 | A5 | A4 | A3 | A2 | A1 | C2 |
|----|-----|-----|-----|----|----|----|----|----|----|----|----|----|----|
|    | GND | RX2+ | RX2- | VBUS | SBU1 | D- | D+ | CC | VBUS | TX1- | TX1+ | GND |    |
|    | GND | TX2+ | TX2- | VBUS | Vconn |   |    | SBU2 | VBUS | RX1- | RX1+ | GND |    |
|    | B1 | B2 | B3 | B4 | B5 | B6 | B7 | B8 | B9 | B10 | B11 | B12 |    |

FIG.16

CONNECTOR AND ELECTRONIC DEVICE INCLUDING THE SAME

CROSS-REFERENCE TO RELATED APPLICATION(S)

This application claims the benefit under 35 U.S.C. § 119(a) of a Korean patent application filed on Jun. 8, 2016 in the Korean Intellectual Property Office and assigned Serial number 10-2016-0071060, the entire disclosure of which is hereby incorporated by reference.

TECHNICAL FIELD

The present disclosure relates to a connector and an electronic device including the same. More particularly, the present disclosure relates to an electric device including a receptacle configured to be connected with an external connector, and a ground member and a control circuit that are electrically connected to the receptacle.

BACKGROUND

With the recent development of a digital technique, various types of electronic devices, such as a mobile communication terminal, a smart phone, a tablet personal computer (PC), a personal digital assistant (PDA), an electronic scheduler, a notebook PC, a wearable device, and a television (TV), are widely used. Such electronic devices are provided with various interfaces for data transmission and support data communication (e.g., transmission or reception) in a wired or wireless manner to correspond to the interfaces that are set among the electronic devices. For example, an interface (such as Bluetooth (BT), wireless fidelity (WiFi), near field communication (NFC)) that is able to exchange data in a wireless manner based on short range communication and an interface (such as universal serial bus (USB)) that is able to exchange data in a wired manner based on a cable are provided.

In a case where a connection between contacts for various functions precedes a ground connection when an external connector of an external electronic device is electrically connected to an electronic device, a harmful component (e.g., noise) may enter into a circuit for the various functions.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a connector, in which a connection order between contacts is designed at the time of connecting the connectors, and an electronic device including the connector.

Another aspect of the present disclosure is to provide a connector that is designed to have priority at the time of an inter-connector connection or at the time of an inter-ground contact connection order between connectors, and an electronic device including the connector.

In accordance with an aspect of the present disclosure, an electronic device is provided. The electronic device includes a receptacle configured to be connected with an external connector, and a ground member and a control circuit that are electrically connected to the receptacle. The receptacle includes a shell configured to accommodate the external connector, a tongue disposed in a space of the shell and enclosed by the shell, at least one first contact disposed on the tongue and electrically connected to the ground member, at least one second contact disposed on the tongue and electrically connected to the control circuit, and at least one third contact that is formed at least a portion of a conductive member included in the tongue and electrically connected to the control circuit. The first contact may have a length further extending over the third contact in a direction where the external connector is separated from the receptacle.

In accordance with another aspect of the present disclosure, when an external connector of an external device is connected to a connector of an electronic device, a ground connection between the connectors is formed first. Therefore, an influence caused by a harmful component can be reduced.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 10 illustrates a contact map of a receptacle according to various embodiments of the present disclosure;

FIG. 16 illustrates a contact map of a plug according to various embodiments of the present disclosure;

Throughout the drawings, like reference numerals will be understood to refer to like parts, components, and structures.

DETAILED DESCRIPTION

Figure 1:
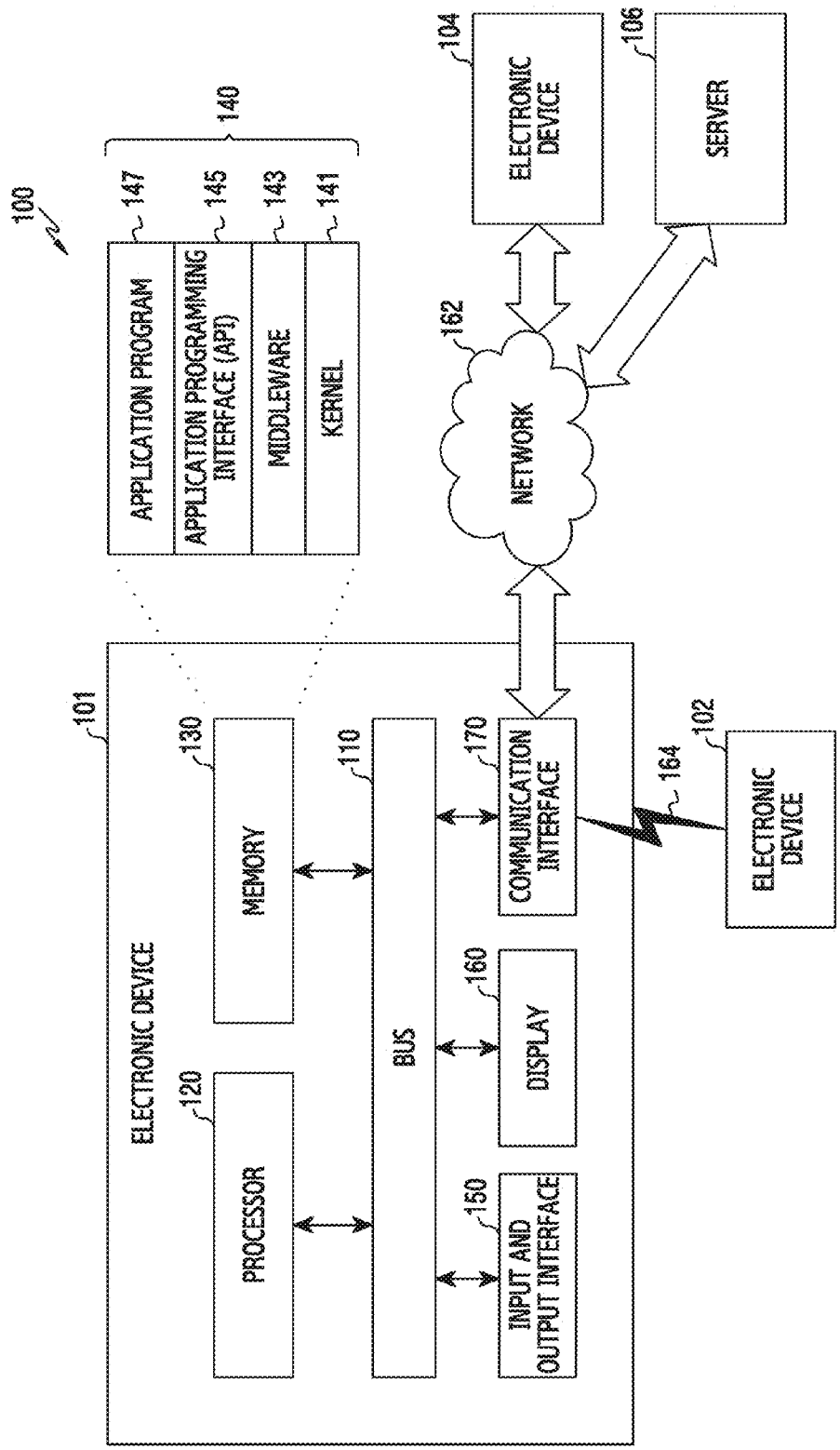
FIG. 1 is a view schematically illustrating an electronic device within a network environment according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

In an embodiment of the present disclosure, the expression "A or B", "at least one of A and/or B", or "A/B" may include all possible combinations of the items listed. The expression "a first", "a second", "the first", or "the second" may modify corresponding elements regardless of the order or importance, and is used only to distinguish one element from another element, but does not limit the corresponding elements. When an element (e.g., first element) is referred to as being "(functionally or communicatively) connected," or "directly coupled" to another element (second element), the element may be connected directly to the another element or connected to the another element through yet another element (e.g., third element).

The expression "configured to" as used in various embodiments of the present disclosure may be interchangeably used with, for example, "suitable for", "having the capacity to", "designed to", "adapted to", "made to", or "capable of" in terms of hardware or software, according to circumstances. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

An electronic device according to various embodiments of the present disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a moving picture expert group (MPEG-1), an MPEG audio layer-3 (MP3) player, a mobile medical device, a camera, and a wearable device. According to various embodiments of the present disclosure, the wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit). In some embodiments of the present disclosure, the electronic device may include at least one of, for example, a television, a digital video disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

In other embodiments of the present disclosure, the electronic device may include at least one of various medical devices (e.g., various portable medical measuring devices (a blood glucose monitoring device, a heart rate monitoring device, a blood pressure measuring device, a body temperature measuring device, and the like), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, and the like). According to some embodiments of the present disclosure, an electronic device may include at least one of a part of furniture or a building/structure, an electronic board, an electronic signature receiving device, a projector, and various types of measuring instruments (e.g., a water meter, an electric meter, a gas meter, a radio wave meter, and the like). In various embodiments of the present disclosure, the electronic device may be flexible, or may be a combination of one or more of the aforementioned various devices. The electronic device according to an embodiment of the present disclosure is not limited to the above described devices. In an embodiment of the present disclosure, the term "user" may indicate a person using an electronic device or a device (e.g., an artificial intelligence electronic device) using an electronic device.

FIG. 1 is a view illustrating a network environment that includes an electronic device according to various embodiments of the present disclosure.

Referring to FIG. 1, descriptions will be made on an electronic device 101 within a network environment 100 in various embodiments with reference to FIG. 1. The electronic device 101 may include a bus 110, a processor 120, a memory 130, an input/output interface 150, a display 160, and a communication interface 170. In a certain embodiment of the present disclosure, the electronic device 101 may omit at least one of the above-mentioned components or may additionally include other components. The bus 110 may include, for example, a circuit that interconnects the above-mentioned components 110 to 170 and transmits communication (e.g., a control message or data) among the components. The processor 120 may include one or more of a CPU, an AP, and a communication processor (CP). The processor 120 may execute, for example, an arithmetic operation or data processing that is related to a control and/or communication of one or more other components of the electronic device 101.

The memory 130 may include a volatile memory and/or a non-volatile memory. The memory 130 may store, for example, commands or data that are related to one or more other components of the electronic device 101. According to an embodiment of the present disclosure, the memory 130 may store software and/or a program 140.

The program 140 may include, for example, a kernel 141, a middleware 143, an AP interface (API) 145, and/or an application program (or an "application") 147. At least one of the kernel 141, the middleware 143, and the API 145 may be referred to as an operating system (OS). The kernel 141 may control or manage, for example, system resources (e.g., the bus 110, the processor 120, or the memory 130) that are used for executing operations or functions implemented in the other programs (e.g., the middleware 143, the API 145, or the application programs 147). In addition, the kernel 141 may provide an interface that allows the middleware 143, the API 145, or the application programs 147 to access individual components of the electronic device 101 so as to control or manage the system resources.

The middleware 143 may play an intermediary role such that, for example, the API 145 or the application programs 147 may communicate with the kernel 141 so as to exchange data. In addition, the middleware 143 may process one or more task requests that are received from the application programs 147, according to priority. For example, the middleware 143 may assign the priority to be capable of using a system resource of the electronic device 101 (e.g., the bus 110, the processor 120, or the memory 130) to at least one of the application programs 147, and may process the one or more task requests. The API 145 is, for example, an interface that allows the applications 147 to control functions provided from the kernel 141 or the middleware 143, and may include, for example, one or more interfaces or functions (e.g., commands) for a file control, a window control, an image processing, or a character control. The input/output interface 150 may transmit commands or data, which are entered from, for example, a user or any other external device, to the other component(s) of the electronic device 101, or may output commands or data, which are received from the other component(s) of the electronic device 101, to the user or the other external device.

The display device 160 may include, for example, a liquid crystal display (LCD), a light emitting diode (LED) display, an organic light emitting Diode (OLED) display, a micro-electro-mechanical system (MEMS), or an electronic paper display. The display 160 may display various contents (e.g., text, image, video, icon, or symbol) to, for example, the user. The display 160 may include a touch screen, and may receive a touch input, a gesture input, a proximity input, or a hovering input that is made using, for example, an electronic pen or a part of the user's body.

The communication interface 170 may set, for example, communication between the electronic device 101 and an external device (e.g., a first external electronic device 102, a second external device 104, or a server 106). For example, the communication interface 170 may be connected with a network 164 through wired or wireless communication so as to communicate with the external device (e.g., the first external electronic device 102). For example, the communication interface 170 may be connected with a network 162 through wired or wireless communication so as to communicate with the external device (e.g., the second external electronic device 104 or the server 106).

The wireless communication may include a cellular communication that uses at least one of, for example, long-term evolution (LTE), LTE advance (LTE-A), code division multiple access (CDMA), wideband CDMA (WCDMA), universal mobile telecommunication system (UMTS), wireless broadband (WiBro), and Global System for Mobile communication (GSM). According to an embodiment of the present disclosure, the wireless communication may include at least one of, for example, wireless fidelity (WiFi), Bluetooth (BT), ZigBee, near field communication (NFC), magnetic stripe transmission (MST), magnetic secure transmission, radio frequency (RF), and body area network (BAN). The MST may generate pulses according to transmission data using an electromagnetic signal, and the pulses may generate a magnetic field signal. The electronic device 101 may transmit the magnetic field signal to a POS, and the POS may detect the magnetic field signal using an MST reader and may convert the detected the magnetic field signal into an electric signal so as to recover the data.

According to an embodiment of the present disclosure, the wireless communication may include GNSS. The GNSS may be, for example, GPS, Global Navigation Satellite System (Glonass), Beidou Navigation Satellite System (hereinafter, "Beidou"), Galileo, or the European global satellite-based navigation system. Herein, "GPS" may be interchangeably used with "GNSS" below. The wired communication may use at least one of, for example, USB, high definition multimedia interface (HDMI), recommended standard 232 (RS-232), and plain old telephone service (POTS).

According to an embodiment of the present disclosure, the wired communication may be implemented through an electric connection between a connector embedded in the electronic device 101 and an external connector embedded in the external device 102. For example, the electronic device 101 may identify the external electronic device 102 connected through the connector. The electronic device 101 may execute various operation flows for controlling signal transmission/reception with the identified external device 102. The electronic device 101 may receive at least one of an analog signal, a digital signal, and a power source (or power) signal from the external electronic device 102, or may transmit such a signal to the external electronic device 102.

According to an embodiment of the present disclosure, the communication interface 170 may support various types of communication standards related to a connector. For example, the communication interface 170 may support USB 3.x.

According to an embodiment of the present disclosure, the processor 120 may execute various operation flows depending on whether the connector of the electronic device 101 and the external connector of the external electronic device 102 are connected to each other. Alternatively, the processor 120 may execute switching between operation modes depending on whether the connector of the electronic device 101 and the external connector of the external electronic device 102 are connected to each other. Alternatively, the processor 120 may execute control flows related to the connectors or other electronic parts depending on whether the connector of the electronic device 101 and the external connector of the external electronic device 102 are connected to each other.

According to an embodiment of the present disclosure, the communication interface 170 may include a receptacle that is connectable to an external connector, a ground member that is electrically connected to the receptacle, and a control circuit. The receptacle may include a shell that is capable of accommodating the external connector, a tongue that is located in a space of the shell and enclosed by the shell, and at least one first contact that is coupled to the tongue and electrically connected to the ground member. In addition, the receptacle may include at least one second contact that is coupled to the tongue and electrically connected to the control circuit. In addition, the receptacle may include at least one third contact that is formed of at least a portion of a conductive member included in the tongue and is electrically connected to the control circuit. According to an embodiment of the present disclosure, the first contact may be designed to be electrically conducted to the external connector earlier than the third contact when the external connector is inserted into the receptacle. For example, the first contact may have a length that further extends in a direction where the external connector is separated from the receptacle, compared to the third contact. According to another embodiment of the present disclosure, the first contact may be designed to be electrically conducted to the external connector earlier than the second contact when the external connector is inserted into the receptacle. For example, the first contact may have a length that further extends in a direction where the external connector is separated from the receptacle, compared to the second contact. Such a connection structure may reduce an influence caused by a harmful component because a ground connection between the connectors is formed first when the external connector of the external electronic device 102 is connected to the connector of the electronic device 101.

The network 162 may include a telecommunication network (e.g., at least one of a computer network (e.g., LAN or WAN), the internet, and a telephone network).

Each of the first and second external electronic devices 102 and 104 may be a type of device that is the same as, or different from, the electronic device 101. According to various embodiments of the present disclosure, all or some of the operations to be executed by the electronic device 101 may be executed by another electronic device or a plurality of other electronic devices (e.g., the electronic devices 102 and 104 or the server 106). According to an embodiment of the present disclosure, in the case where the electronic device 101 should perform a certain function or service automatically or by a request, the electronic device 101 may request some functions or services that are associated therewith from the other electronic devices (e.g., the electronic devices 102 and 104 or the server 106), instead of, or in addition to, executing the functions or service by itself. The other electronic devices (e.g., the electronic devices 102 and 104 or the server 106) may execute the requested functions or additional functions, and may deliver the results to the electronic device 101. The electronic device 101 may provide the requested functions or services by processing the received results as they are or additionally. For this purpose, for example, a cloud computing technique, a distributed computing technique, or a client-server computing technique may be used.

Figure 2:
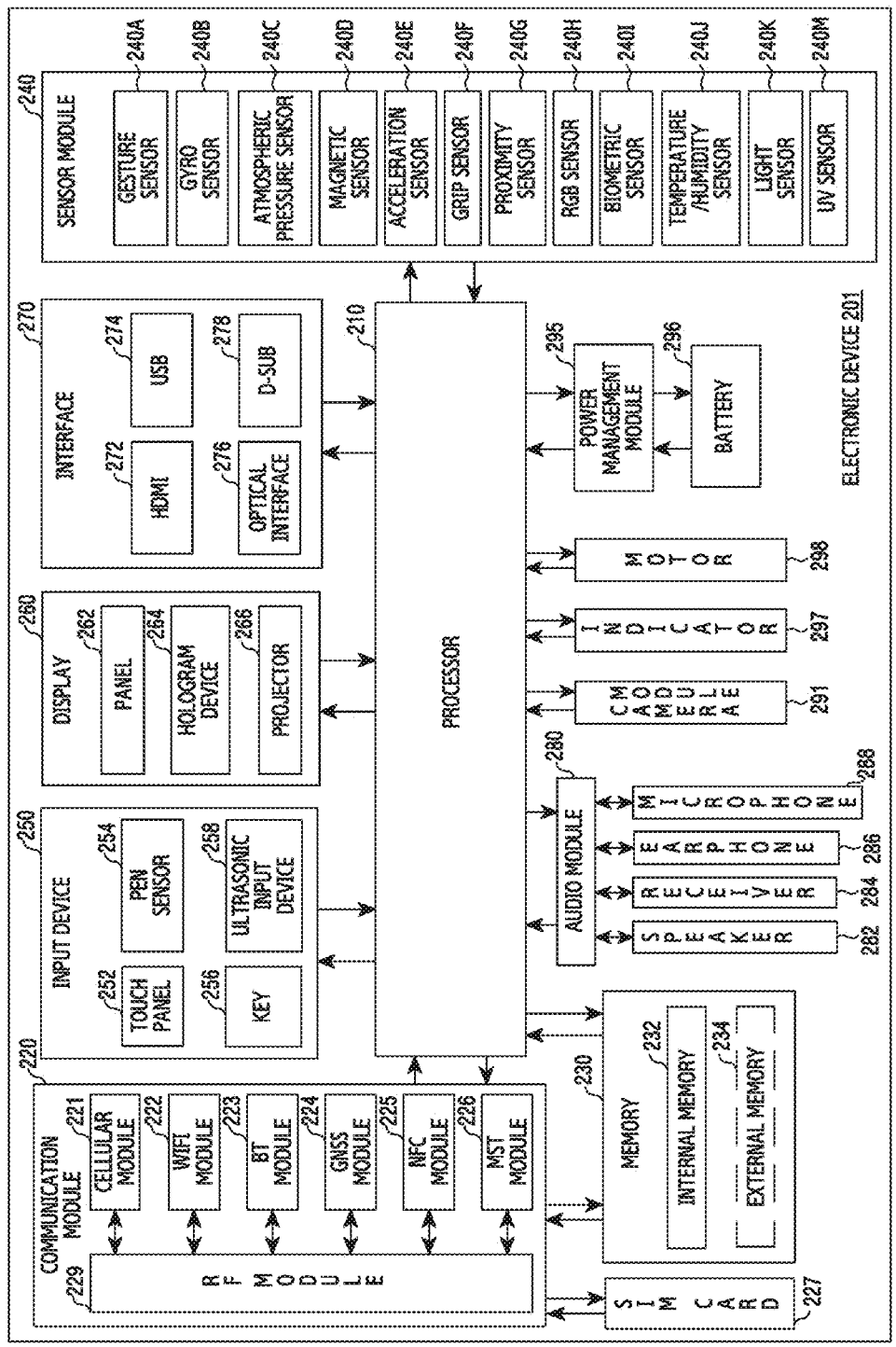
FIG. 2 is a block diagram of an electronic device according to various embodiments of the present disclosure.

FIG. 2 is a block diagram of an electronic device according to various embodiments of the present disclosure.

Referring to FIG. 2, an electronic device 201 may include, for example, the whole or a portion of the electronic device 101 illustrated in FIG. 1. The electronic device 201 may include at least one processor (e.g., an AP) 210, a communication module 220, a subscriber identification module 227, a memory 230, a sensor module 240, an input device 250, a display 260, an interface 270, an audio module 280, a camera module 291, a power management module 295, a battery 296, an indicator 297, and a motor 298.

The AP 210 may drive, for example, an operating system or an application program so as to control a plurality of hardware or software components connected thereto, and may also perform various data processing and arithmetic operations. The processor 210 may be implemented by, for example, a system-on-chip (SoC). According to an embodiment of the present disclosure, the AP 210 may further include a graphics processing unit (GPU) and/or an image signal processor. The AP 210 may include at least some components (e.g., a cellular module 221) among the components illustrated in FIG. 2. The processor 210 may load a command or data received from at least one of the other components (e.g., a non-volatile memory) in a volatile memory so as to process the command and data, and may store result data in a non-volatile memory.

The communication module 220 may have a configuration that is the same as, or similar to, the communication interface 170. The communication module 220 may include, for example, the cellular module 221, a WiFi module 222, a BT module 223, a GNSS module 224, an NFC module 225, an MST module 226, and an RF module 229. The cellular module 221 may provide, for example, a voice call, a video call, a message service, or an internet service through a communication network. According to an embodiment of the present disclosure, the cellular module 221 may perform discrimination and authentication of the electronic device 201 within the communication network by using the subscriber identification module (e.g., a SIM card) 227. According to an embodiment of the present disclosure, the cellular module 221 may perform at least some of the control functions that may be provided by the AP 210. According to an embodiment of the present disclosure, the cellular module 221 may include a CP. According to a certain embodiment of the present disclosure, at least some (e.g., two or more) of the cellular module 221, the WiFi module 222, the Bluetooth module 223, the GNSS module 224, the NFC module 225, and the MST module 226 may be incorporated in a single integrated chip (IC) or an IC package. The RF module 229 may transmit/receive a communication signal (e.g., an RF signal). The RF module 229 may include, for example, a transceiver, a power amp module (PAM), a frequency filter, a low noise amplifier (LNA), or an antenna. According to another embodiment of the present disclosure, at least one of the cellular module 221, the WiFi module 222, the Bluetooth module 223, the GNSS module 224, the NFC module 225, and the MST module 226 may transmit/receive an RF signal through one or more separate RF modules. The subscriber identification module 227 may include, for example, a card that includes a subscriber identification module and/or an embedded SIM, and may also include intrinsic identification information (e.g., IC card identifier (ICCID)) or subscriber information (e.g., international mobile subscriber identity (IMSI)).

The memory 230 (e.g., the memory 130) may include, for example, an internal memory 232 or an external memory 234. The internal memory 232 may include at least one of, for example, a volatile memory (e.g., a dynamic random access memory (DRAM), a static RAM (SRAM), or a standard dynamic RAM (SDRAM)), a non-volatile memory (e.g., an one time programmable read only memory (OTPROM), a programmable ROM (PROM), an erasable PROM (EPROM), an electrically EPROM (EEPROM), a mask ROM, a flash ROM, a flash memory, a hard drive, and a solid state drive (SSD). The external memory 234 may further include a flash drive (e.g., a compact flash (CF), a secure digital (SD), a micro secure digital (Micro-SD), a mini secure digital (Mini-SD), an extreme digital (xD), a multi-media card (MMC), or a memory stick). The external memory 234 may be functionally or physically connected to the electronic device 201 through various interfaces.

For example, the sensor module 240 may measure a physical quantity or may detect an operating status of the electronic device 201, and may then convert the measured or detected information into electric signals. The sensor module 240 may include at least one of, for example, a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (e.g., red, green, blue (RGB) sensor), a biometric sensor 240I, a temperature/humidity sensor 240J, an illuminance sensor 240K, and an ultra-violet (UV) sensor 240M. Additionally or alternatively, the sensor module 240 may include, for example, an E-nose sensor, an electromyography (EMG) sensor, an electroencephalogram (EEG) sensor, an electrocardiogram (ECG) sensor, an infra-red (IR) sensor, an iris sensor, and/or a fingerprint sensor. The sensor module 240 may further include a control circuit for controlling one or more sensors incorporated therein. In a certain embodiment of the present disclosure, the electronic device 201 may further include a processor configured to control the sensor module 240 as a part of the AP 210 or separate from the AP 210 so as to control the sensor module 240 while the AP 210 is in the sleep state.

The input device 250 may include, for example, a touch panel 252, a (digital) pen sensor 254, a key 256, or an ultrasonic input device 258. As the touch panel 252, at least one of, for example, a capacitive type touch panel, a resistive type touch panel, an infrared type touch panel, and an ultrasonic type panel may be used. In addition, the touch panel 252 may further include a control circuit. The touch panel 252 may further include a tactile layer so as to provide a tactile reaction to the user. The (digital) pen sensor 254 may be, for example, a portion of the touch panel, or may include a separate recognition sheet. The key 256 may include, for example, a physical button, an optical key, or a keypad. The ultrasonic input device 258 may detect, through a microphone (e.g., a microphone 288), ultrasonic waves generated by an input tool so as to confirm data corresponding to the detected ultrasonic waves.

The display 260 (e.g., the display 160) may include a panel 262, a hologram device 264, a projector 266, and/or a control circuit for controlling these components. The panel 262 may be implemented to be, for example, flexible, transparent, or wearable. The panel 262 may be constituted with the touch panel 252 and one or more modules. The hologram device 264 may show a stereoscopic image in the air using interference of light. The projector 266 may project light onto a screen so as to display an image. The screen may be located, for example, inside or outside the electronic device 201.

The interface 270 may include, for example, an HDMI 272, a USB 274, an optical interface 276, or a D-subminiature (D-sub) 278. For example, the interface 270 may be included in the communication interface 170 illustrated in FIG. 1. Additionally or alternatively, the interface 270 may include, for example, a Mobile high-definition link (MHL) interface, an SD card/MMC interface, or an infrared data association (IrDA) standard interface.

According to an embodiment of the present disclosure, the interface 270 may include a receptacle (not illustrated). The receptacle may include a shell that is capable of accommodating the external connector, a tongue that is located in a space of the shell and enclosed by the shell, and at least one first contact that is coupled to the tongue and electrically connected to the ground member. In addition, the receptacle may include at least one second contact that is coupled to the tongue and electrically connected to the control circuit. In addition, the receptacle may include at least one third contact that is formed of at least a portion of a conductive member included in the tongue and electrically connected to the control circuit. According to an embodiment of the present disclosure, the first contact may be designed to be electrically conducted to the external connector earlier than the third contact when the external connector is inserted into the receptacle. For example, the first contact may have a length that further extends in a direction where the external connector is separated from the receptacle, compared to the third contact. According to another embodiment of the present disclosure, the first contact may be designed to be electrically conducted to the external connector earlier than the second contact when the external connector is inserted into the receptacle. For example, the first contact may have a length that further extends in a direction where the external connector is separated from the receptacle, compared to the second contact. Such a connection structure may reduce an influence caused by a harmful component since a ground connection between the connectors is first formed when the external connector of the external electronic device is connected to the connector of the electronic device 201.

The audio module 280 may bi-directionally convert, for example, sound and electric signals. At least some of the components of the audio module 280 may be included in, for example, the input/output interface 150 illustrated in FIG. 1. The audio module 280 may process sound information input or output through, for example, a speaker 282, a receiver 284, an earphone 286, or a microphone 288. The camera module 291 is a device that is capable of photographing, for example, a still image and a video image, and according to an embodiment of the present disclosure, the camera module 291 may include at least one image sensor (e.g., a front sensor or a rear sensor), a lens, an image signal processor (ISP), or a flash (e.g., an LED or a xenon lamp). The power management module 295 may manage, for example, the electric power of the electronic device 201. According to an embodiment of the present disclosure, the power management module 295 may include a power management IC (PMIC), a charger IC, or a battery or fuel gauge. The PMIC may be configured in a wired and/or wireless charge type. The wireless charge type may include, for example, a magnetic resonance type, a magnetic induction type, or an electromagnetic wave type, and may further include an additional circuit for wireless charging (e.g., a coil loop, a resonance circuit, or a rectifier). The battery gauge may measure the residual capacity of the battery 296, as well as the voltage, current, or temperature during the charge. The battery 296 may include, for example, a rechargeable battery and/or a solar battery.

The indicator 297 may indicate a specific status (e.g., a booting status, a message status, or a charged status) of the electronic device 201 or of a part thereof (e.g., AP 210). The motor 298 may convert an electric signal into a mechanical vibration, and may generate, for example, a vibration or a haptic effect. The electronic device 201 may include, for example, a mobile TV support device (e.g., a GPU) that is capable of processing media data according to a standard of, for example, digital multimedia broadcasting (DMB), digital video broadcasting (DVB), or MediaFlo™ Each of the components described herein may be constituted with one or more components, and the names of the corresponding components may vary depending on a type of an electronic device. In various embodiments of the present disclosure, an electronic device (e.g., the electronic device 201) may not include some of the components, or may include an additional component. Or, some of the components are combined with each other to constitute one object and to similarly perform the functions of the corresponding components prior to the combination.

Figure 3:
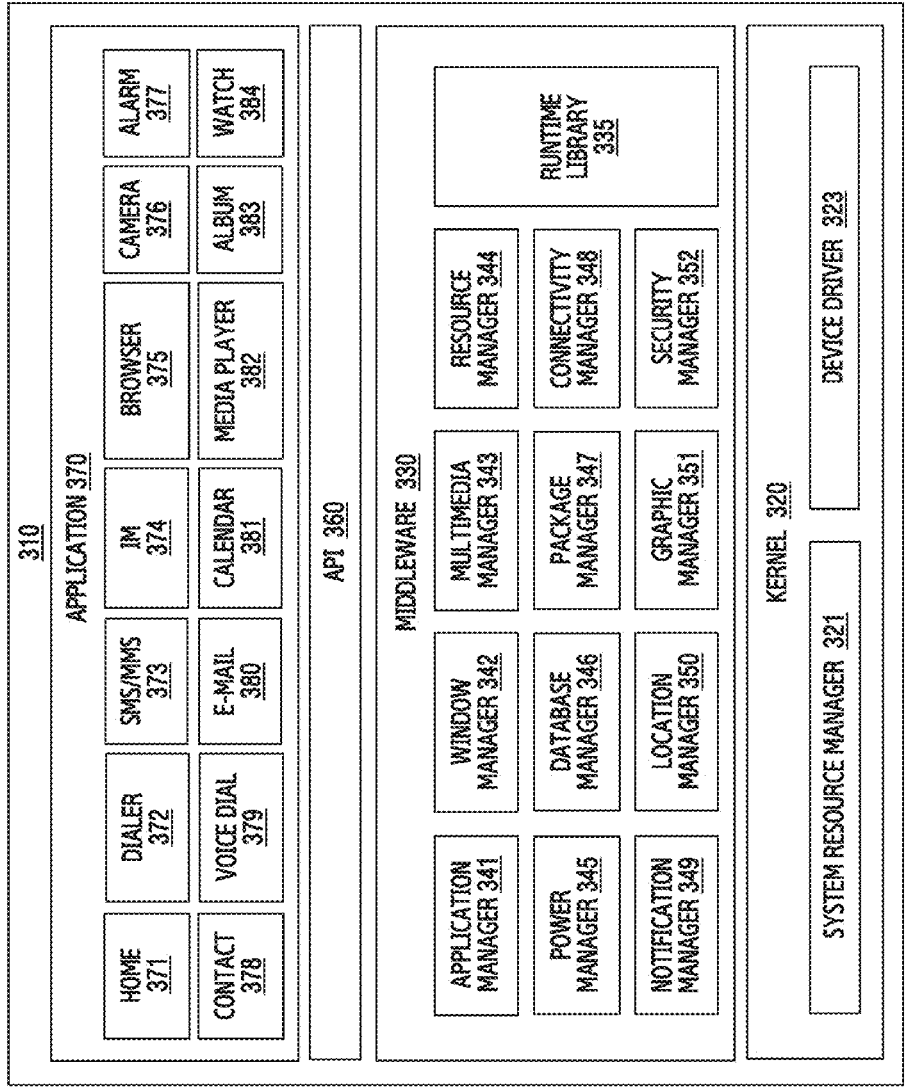
FIG. 3 is a block diagram illustrating a program module according to various embodiments of the present disclosure.

FIG. 3 is a block diagram illustrating a program module according to various embodiments of the present disclosure.

Referring to FIG. 3, according to an embodiment of the present disclosure, a program module 310 (e.g., the program 140) may include an OS that controls resources associated with an electronic device (e.g., the electronic device 101) and/or various applications (e.g., the application program 147) that are driven on the operating system. The operating system may include, for example, Android™, iOS™, Windows™, Symbian™, Tizen™, or Bada™.

Referring to FIG. 3, the program module 310 may include a kernel 320 (e.g., the kernel 141), a middleware 330 (e.g., the middleware 143), an API 360 (e.g., the API 145), and/or an application 370 (e.g., the application program 147). At least a part of the program module 310 may be preloaded on the electronic device, or may be downloaded from an external electronic device (e.g., the electronic device 102 or 104, or the server 106).

The kernel 320 may include, for example, a system resource manager 321 and/or a device driver 323. The system resource manager 321 may perform, for example, a control, allocation, or recovery of a system resource. According to an embodiment of the present disclosure, the system resource manager 321 may include, for example, a process management unit, a memory management unit, or a file system management unit. The device driver 323 may include, for example, a display driver, a camera driver, a Bluetooth driver, a common memory driver, a USB driver, a keypad driver, a WiFi driver, an audio driver, or an inter-process communication (IPC) driver. The middleware 330 may provide, for example, a function that is commonly required by the applications 370, or may provide various functions to the applications 370 through the API 360 such that the applications 370 can efficiently use the limited system resources within the electronic device. According to an embodiment of the present disclosure, the middleware 330 may include at least one of, for example, a runtime library 335, an application manager 341, a window manager 342, a multimedia manager 343, a resource manager 344, a power manager 345, a database manager 346, a package manager 347, a connectivity manager 348, a notification manager 349, a location manger 350, a graphic manager 351, and a security manager 352.

The runtime library 335 may include, for example, a library module that is used by a compiler in order to add a new function through a program language while the applications 370 are executed. The runtime library 335 may perform, for example, input/output management, memory management, or processing of an arithmetic function. The application manager 341 may manage, for example, a life cycle of the applications 370. The window manager 342 may manage a GUI resource that is used in a screen. The multimedia manager 343 may grasp a format required for reproducing various media files, and may perform encoding or decoding of the media files by using a codec that is suitable for the corresponding format. The resource manager 344 may manage a source code of the applications 370 or a memory space. The power manager 345 may manager, for example, a battery capacity or power, and may provide power information required for operating the electronic device. According to an embodiment of the present disclosure, the power manager 345 may be interlocked with a basic input/output system (BIOS). The database manager 346 may generate, retrieve, or change, for example, a database to be used by the applications 370. The package manager 347 may manage the installation or update of an application that is distributed in the form of a package file.

The connectivity manager 348 may manage, for example, a wireless connection. The notification manager 349 may provide, to the user, events of, for example, arrival massage, promise, or proximity notification. The location manager 350 may manage, for example, position information of the electronic device. The graphic manager 351 may manage a graphic effect to be provided to the user or a user interface associated therewith. The security manager 352 may provide, for example, system security or user authentication. According to an embodiment of the present disclosure, the middleware 330 may include a telephony manager that manages a voice or video call function of the electronic device or a middleware module that may combine the functions of the above-described components. According to an embodiment of the present disclosure, the middleware 330 may provide a module that is specialized for each kind of operation system. The middleware 330 may dynamically delete some of the existing components or add new components. The API 360 is, for example, a collection of API programming functions, and may be provided in different configurations depending on operation systems. For example, Android or iOS may provide one API set for each platform, and Tizen may provide two or more API sets for each platform.

The applications 370 may include one or more applications for providing, for example, a home 371, a dialer 372, an SMS/MMS 373, an instant message (IM) 374, a browser 375, a camera 376, an alarm 377, a contact 378, a voice dial 379, an e-mail 380, a calendar 381, a media player 382, an album 383, a watch 384, health care information (e.g., measurement of a quantity of motion, or blood sugar), or environmental information (e.g., atmospheric pressure, humidity, or temperature information). According to an embodiment of the present disclosure, the applications 370 may include an information exchange application that may support information exchange between the electronic device and an external electronic device. The information exchange application may include, for example, a notification relay application to transmit specific information to the external electronic devices, or a device management application to manage the external electronic devices. For example, the notification relay application may relay notification information generated by another application of the electronic device, or may receive notification information from an external electronic device and may provide the notification information to the user. The device management application may, for example, install, delete, or update a function of an external electronic device that communicates with the electronic device (e.g., turn-on/turn-off of the external electronic device itself (or some components thereof) or adjustment of brightness (or resolution) of a display), or an application operated in the external electronic device. According to an embodiment of the present disclosure, the applications 370 may include an application designated according to an attribute of an external electronic device (e.g., a healthcare application of a mobile medical device). According to an embodiment of the present disclosure, the applications 370 may include an application received from an external electronic device. At least a part of the program module 310 may be implemented (e.g., executed) by software, firmware, hardware (e.g., the processor 210), or a combination of at least two of them, and may include a module, a program, a routine, a command set, or a process for performing one or more functions.

The term "module" as used herein may include a unit consisting of hardware, software, or firmware, and may, for example, be used interchangeably with the term "logic", "logical block", "component", "circuit", or the like. The "module" may be an integrated component, or a minimum unit for performing one or more functions or a part thereof. The "module" may be mechanically or electronically implemented and may include, for example, an application-specific IC (ASIC) chip, a field-programmable gate arrays (FPGA), or a programmable-logic device, which has been known or are to be developed in the future, for performing certain operations. At least some of devices (e.g., modules or functions thereof) or methods (e.g., operations) according to various embodiments may be implemented by an instruction which is stored in a computer-readable storage medium (e.g., the memory 130) in the form of a program module. The instruction, when executed by a processor (e.g., the processor 120), may cause the one or more processors to execute the function corresponding to the instruction. The computer-readable storage medium may include a hard disk, a floppy disk, a magnetic medium (e.g., a magnetic tape), an optical media (e.g., compact disk ROM (CD-ROM), DVD), a magneto-optical media (e.g., a floptical disk), an inner memory, and the like. The instruction may include a code which is made by a compiler or a code which may be executed by an interpreter. The programming module according to the present disclosure may include one or more of the aforementioned components or may further include other additional components, or some of the aforementioned components may be omitted. Operations performed by a module, a programming module, or other elements according to various embodiments may be executed sequentially, in parallel, repeatedly, or in a heuristic manner. At least some operations may be executed according to another sequence, may be omitted, or may further include other operations.

Figure 4:
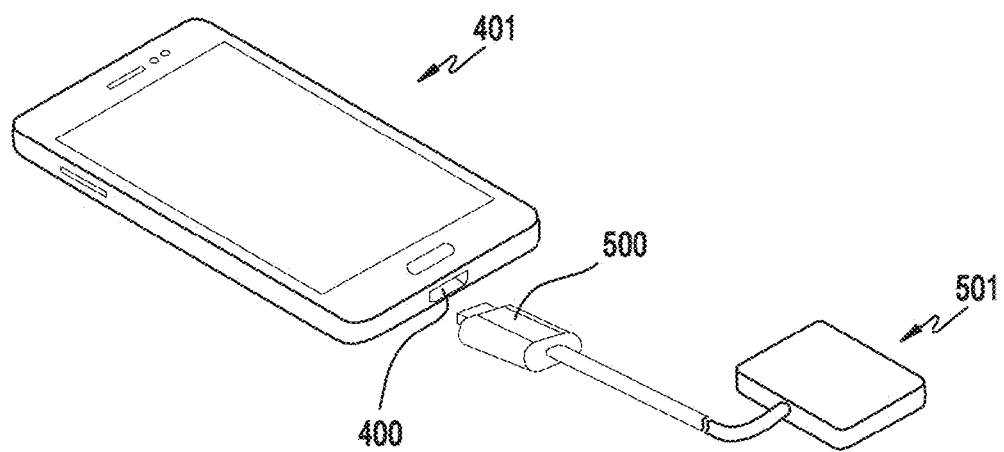
FIG. 4 illustrates a connection between an electronic device and an external device according to various embodiments of the present disclosure.
Figure 5:
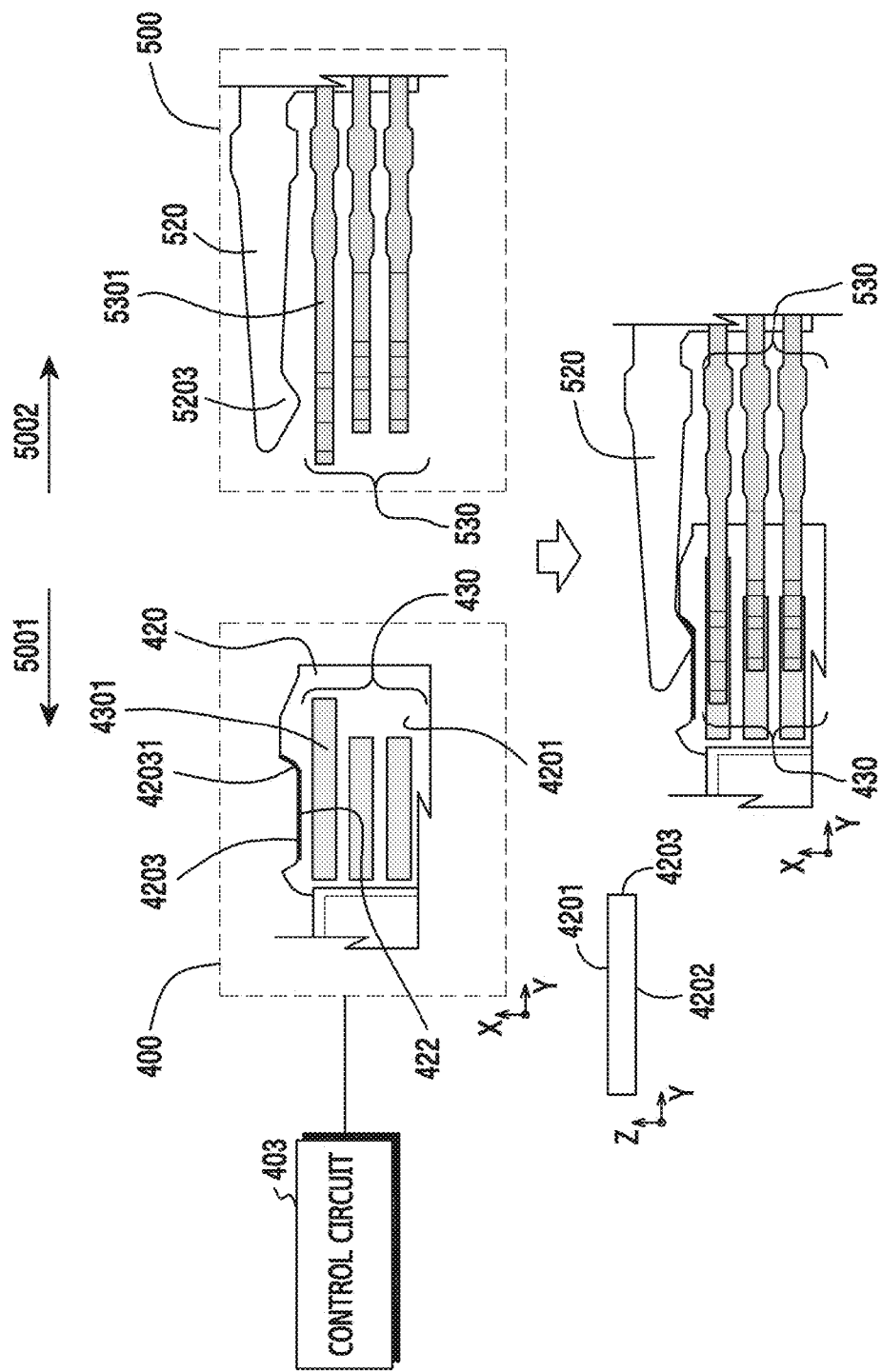
FIG. 5 illustrates an inter-connector connection structure of an electronic device and an external device, and a circuit using the same according to various embodiments of the present disclosure.
Figure 6:
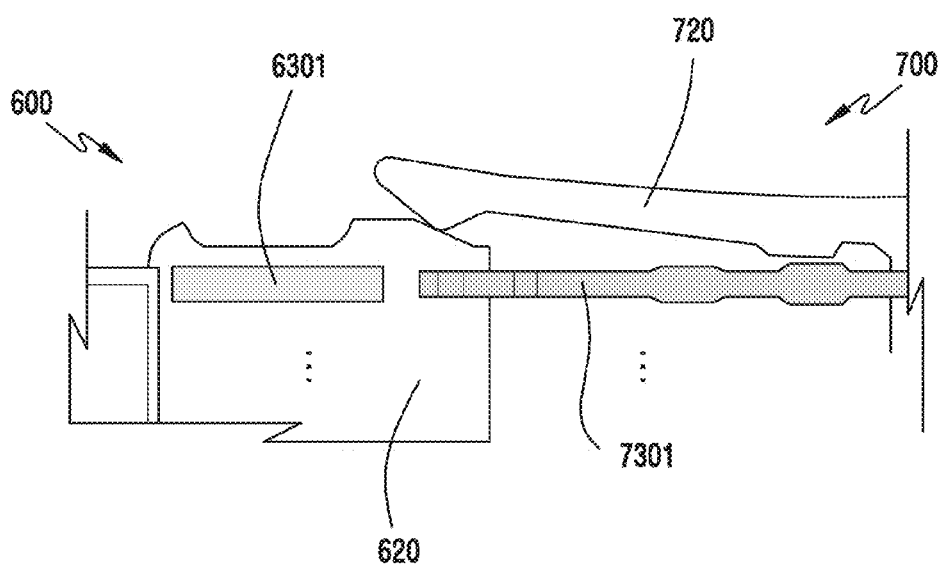
FIGS. 6 and 7 illustrate inter-connector connection structures according to various embodiments of the present disclosure.
Figure 7:
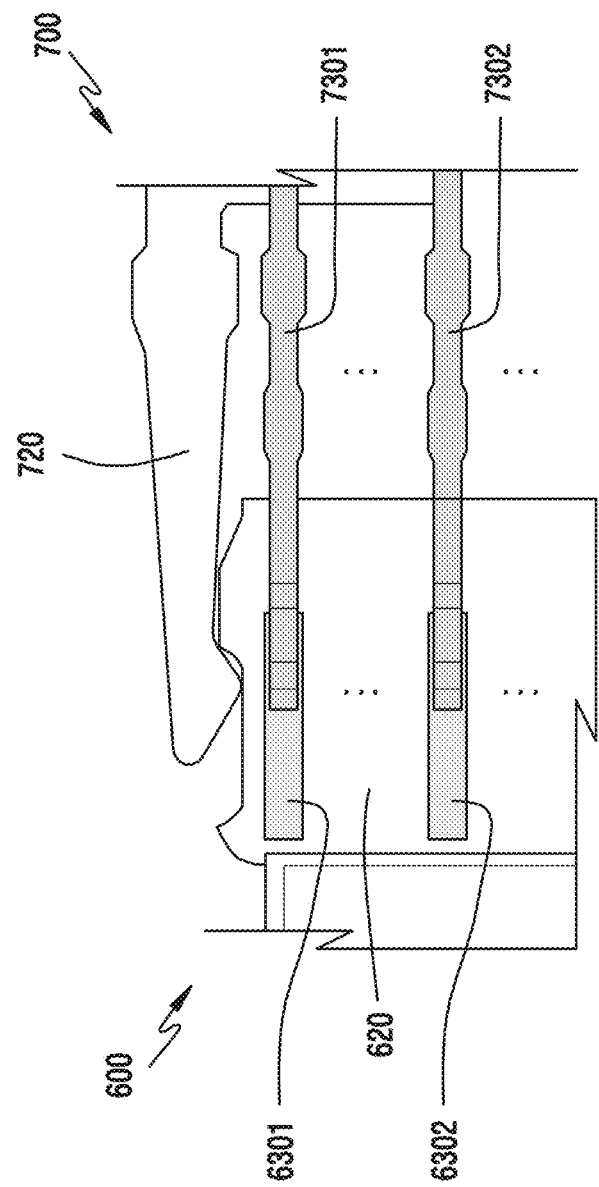

FIG. 4 illustrates a connection between an electronic device and an external device according to various embodiments of the present disclosure. FIG. 5 illustrates an inter-connector connection structure of an electronic device and an external device, and a circuit using the same according to various embodiments of the present disclosure. FIGS. 6 and 7 illustrate inter-connector connection structures to according to various embodiments of the present disclosure.

Referring to FIGS. 4 to 7, according to various embodiments of the present disclosure, an electronic device 401 may include the electronic device 101 of FIG. 1. Alternatively, an external device 501 may include the external electronic devices 102, 104, and 106 of FIG. 6.

According to an embodiment of the present disclosure, the external device 501 may be any of various types of electronic devices. For example, the external device 501 may include a device configured to input/output an analog signal or a digital signal (e.g., a headset, a speaker, or a USB memory). Alternatively, the external device 501 may include a charging device that supplies power.

Referring to FIG. 4, the electronic device 401 may include a connector (e.g., a receptacle) 400. According to an embodiment of the present disclosure, the connector 400 may be installed within the electronic device 401, and may be disposed in the vicinity of an opening formed on one face of the housing. In the case where an external connector (e.g., a plug) 500 connected to the external device 501 is coupled to the external connector 500 of the electronic device 401 through the opening of the housing, the electronic device 401 and the external device 501 may be electrically connected to each other.

According to an embodiment of the present disclosure, the electronic device 401 may exchange various signals with the external device 501 through the electric connection between the connector 400 and the external connector 500. For example, the electronic device 401 may identify the external device 501 connected thereto through the connector 400. The electronic device 401 may execute various operation flows for controlling signal transmission/reception with the identified external device 501. The electronic device 401 may receive at least one of an analog signal, a digital signal, and a power source (or power) signal from the external device 501, or may transmit such a signal to the external device 501.

The connector 400 and the external connector 500 may include a connector that supports various types of communication standards. According to an embodiment of the present disclosure, the connector 400 and the external connector 500 may include a C-type connector or a reversible connector that supports USB 3.x. The C-type external connector 500 is connectable to the C-type connector 400 of the electronic device 401 irrespective of top and bottom.

Referring to FIG. 5, according to an embodiment of the present disclosure, the connector 400 of the electronic device 401 may include a tongue 420 and a plurality of contacts 430 arranged in the tongue 420. The tongue 420 has a substantially plate-like shape, and may be enclosed by a shell (not illustrated) of the connector 400. The plurality of contacts 430 may be arranged in a direction that substantially intersects (e.g., orthogonally) the insertion direction 5001 or separation direction 5002 of the external connector 500. The plurality of contacts 430 may take a form of being elongated in the separation direction 5002 of the external connector 500.

According to an embodiment of the present disclosure, the tongue 420 may include a first face 4201 and a second face 4202, which face in the opposite directions, and may also include a third face 4203 that encloses a space between the first face 4201 and the second face 4202. According to an embodiment of the present disclosure, the plurality of contacts 430 may be arranged on at least one of the first face 4201 and the second face 4202.

According to an embodiment of the present disclosure, the external connector 500 may include a plurality of contacts 530. The plurality of contacts 530 may be arranged in a direction that substantially intersects (e.g., orthogonally) the insertion direction 5001 or separation direction 5002 of the external connector 500. The plurality of contacts 530 may take a form of being elongated in the insertion direction 5001 of the external connector 500. For example, when the connector 400 and the external connector 500 are coupled to each other, the plurality of contacts 430 of the connector 400 may be electrically conducted to the plurality of contacts 530 of the external connector 500, respectively.

According to an embodiment of the present disclosure, upon being connected to each other through the connector 400 and the external connector 500, the electronic device 401 and the external connector 501 may be operated to be distinct from each other as a host (e.g., a downstream facing port (DSP)) and a device (or a slave) (e.g., an upstream facing port (UFP)).

According to another embodiment of the present disclosure, the electronic device 401 and the external device 501 may operate as a dual role port (DRP), in addition to the host (DFP) and the device (UFP). The DRP may exhibit a mode (function) that is capable of adaptively changing the role of the host (DFP) or the device (UFP) of the electronic device. For example, in the case of being connected to the host (DFP), the DRP may be changed into the device (UFP), and in the case of being connected to the device (UFP), the DRP may be changed into the host DFP. In another example, in the case where two (2) DRPs are connected together, the DPRs may randomly serve as any of the host (DFP) and the device (UFP). For example, one DPR may operate as the host (DFP) and the other may serve as the device (UFP). For example, an electronic device 101, such as a smart phone or a PC, is capable of serving as both of the host (DFP) and the device (UFP), and for this purpose, may periodically toggle pull-up and pull-down.

According to an embodiment of the present disclosure, the external connector 500 may include an extension 520 in a form elongated in the insertion direction 5001. The extension 520 may be disposed outside the plurality of contacts 530. For example, a pair of extensions 520 may be formed, and the plurality of contacts 530 may be disposed between the pair of extensions 520. The extension 520 may be used for physically fastening between the connector 400 and the external connector 500.

According to an embodiment of the present disclosure, the extension 520 of the external connector 500 may be fixed at one end and may be free at the other end like a cantilever. According to an embodiment of the present disclosure, the free end of the extension 520 may include a hook 5203 for snap-fit fastening.

According to an embodiment of the present disclosure, the tongue 420 may include a hook fastening portion 42031 to which the hook 5203 of the external connector 500 is capable of being fastened. When viewed in a plan view, the hook fastening portion 42031 is formed on the third face 4203 of the tongue 420, and may include a latch operation that prevents the hook 5203 from being released in the separation direction 5002 of the external connector 500. For example, in the case where the external connector 500 is inserted into the connector 400, the extension 520 (latch or contact) may be fastened to the hook fastening portion 42031 through an elastic flexural deformation (e.g., deflection).

According to an embodiment of the present disclosure, at least a portion 422 of the tongue 420 may contain a conductive material. At least a portion of the extension 520 of the external connector 500 may contain a conductive material. For example, in the case where the extension 520 of the external connector 500 is coupled to the hook fastening portion 42031 of the connector 400, the conductive portion 422 of the tongue 420 of the connector 400 may be electrically connected to the conductive extension 520 of the external connector 500.

According to an embodiment of the present disclosure, the connector 400 may be electrically connected to a control circuit 403 that is equipped in the electronic device 401.

According to an embodiment of the present disclosure, the control circuit 403 may include a power management unit (PMU) (not illustrated). For example, the PMU may control a power source so as to minimize the power consumption caused according to the operation of a processor (e.g., the processor 120 in FIG. 1 or the processor 210 FIG. 2). Alternatively, the PMU may control a charge operation based on the charged state of a battery or the like. Alternatively, the MPM may control a power transmission/reception operation for the external device 501 connected to the connector 400 through a Vbus contact or a CC contact of the connector 400.

According to an embodiment of the present disclosure, the control circuit 403 may include a processor (e.g., an AP) (not illustrated). The processor may control the entire operation of the electronic device 401. For example, the processor may transmit/receive a digital data signal. For example, the processor may transmit a USB data signal (e.g., USB D$^+$, USB D$^-$) to a USB controller. In another example, the processor may transmit a signal for controlling the operation of the USB controller. For example, when the kind of external device 501 connected through the connector 400 is identified, the processor may transmit, to the USB controller, a signal that causes a signal suitable for the identified external device 501 (or the kind of the external device) to be transmitted.

According to an embodiment of the present disclosure, the control circuit 403 may include a USB controller (not illustrated). For example, the USB controller may detect whether the external device 501 is connected, the operation mode of the electronic device 401, the kind of the connected external device 501, or the like, at least based on a signal received through the plurality of contacts 430 of the connector 400.

According to an embodiment of the present disclosure, the USB controller may acquire information included in a channel configuration (CC) signal received from a CC contact of the connector 400 (e.g., information for impedance of a pull-down resistance (or a voltage measured based on the pull-down resistance), a voltage measured at an open state, or a resistance by a cable), and may detect whether the external device 501 is connected, the operation mode of the electronic device 401, or the kind of the connected external device 501, at least based on such information.

According to an embodiment of the present disclosure, the USB controller may detect the kind of the external device 501 connected to the electronic device 401, at least based on a side band use (SBU) signal received from the SBU contact of the connector 400. The USB controller may detect the kind of the external device 501 connected to the electronic device 401 by confirming an ID of the external device 501 (or an ID impedance value of the external device) included in the SBU signal.

According to an embodiment of the present disclosure, the USB controller may include a communication IC, and may detect the kind of the external device 501 connected to the electronic device 401 by performing, by the communication IC, communication with the external device 501 through the SBU contact of the connector 400. For example, the communication IC may transmit/receive a signal that includes the audio output type, the kind of the external device 501, and a unique number of the external device 501 through the SBU contact of the connector 400. In another example, the communication IC may certify a vendor by performing communication with the external device 501 through the SBU contact of the connector 400.

According to an embodiment of the present disclosure, the control circuit 403 may detect an electric connection between the tongue 420 of the connector 400 and the extension 520 of the external connector 500 through pull-up, pull-down, or the like.

According to an embodiment of the present disclosure, the control circuit 403 of the electronic device 401 may execute various operation flows depending on whether the tongue 420 of the connector 400 and the extension 520 of the external connector 500 are electrically connected to each other. For example, the control circuit 403 may recognize that the external connector 500 is in the state of being connected to the connector 400 when detecting the electric connection between the tongue 420 of the connector 400 and the extension 520 of the external connector 500. As another example, the control circuit 403 performs a control related to various electronic components depending on whether the connector 400 and the external connector 500 are electrically connected to each other. As another example, the control circuit 403 performs switching between operating modes depending on whether the connector 400 and the external connector 500 are electrically connected to each other. The modes may be related to a software program or may be related to various supported by at least one electronic component.

According to an embodiment of the present disclosure, the control circuit 403 may selectively activate at least some of the plurality of contacts 430 (e.g., a CC contact) depending on whether the tongue 420 of the connector 400 and the extension 520 of the external connector 500 are electrically connected to each other.

According to an embodiment of the present disclosure, at least some of the plurality contacts 430 of the connector 400 may protrude more in the separation direction 5002 of the external connector 500, compared to the other contacts. Or, at least some of the plurality contacts 530 of the external connector 500 may protrude more in the insertion direction 5001 of the external connector 500, compared to the other ones. When the connector 400 and the external connector 500 are coupled to each other, some of the plurality of contacts 430 of the connector 400 are electrically conducted to the external connector 500 earlier than the other contacts.

According to an embodiment of the present disclosure, when the external connector 500 is inserted into the connector 400, an electric connection between the ground contact 4301 of the connector 400 and the ground contact 5301 of the external connector 500 may be formed earlier than an electric connection between the tongue 420 of the connector 400 and the extension 520 of the external connector 500. In order to form such a connection structure, for example, the ground contact 4301 of the connector 400 may have a length extending more than the other contacts in the separation direction 5002 of the external connector 500. Alternatively, the ground contact 5301 of the external connector 500 may have a length extending more than the other contacts in the insertion direction 5001 of the external connector 500. Such a connection structure may prevent a malfunction of the control circuit 403 that executes various operation flows by using the connection between the tongue 420 of the connector 400 and the extension 520 of the external connector 500. Hereinafter, at least a portion of the control circuit 403 connected to the tongue 420 of the connector 400 will be referred to as an "external connector detector."

According to an embodiment of the present disclosure, when the connector 400 and the external connector 500 are connected to each other, an electric connection between the ground contact 4301 of the connector 400 and the ground contact 5301 of the external connector 500 may be formed earlier than a power-related contact of the connector 400 (e.g., Vbus) (or a contact required power application (e.g., the CC contact)) electric connection between a corresponding contact of the external connector 500. Such a connection structure may prevent the malfunction of the external connector detector.

Referring to FIG. 6, when an external connector 700 is inserted into a first position of a connector 600, the tongue 620 of the connector 600 and the extension 720 of the external connector 700 may be electrically connected with each other, but a ground contact 6301 of the connector 600 and the ground contact 7301 of the external connector 700 may not be electrically connected with each other. When a harmful component, such as an overcurrent, an overvoltage, an overpower, a momentary pulse, or noise is generated, the harmful component may cause the malfunction of the external connector detector. For example, when the external connector 700 is inserted into the first position of the connector 600 of the electronic device, noise, which interferes with the external connector detector, may be generated by one or more power-related contacts of the connector 600 and/or the external connector 700. In another example, when the external connector 700 is inserted into the first position of the connector 600 of the electronic device, at least one of the other contacts (e.g., the Vbus contact or the CC contact) of the connector 600 may be connected to the external connector 700. Through the connection between the contacts, the electronic device may transmit power to the external device, or the external device may transmit power to the electronic device. By the power flow between the contacts, noise, which interferes with the external connector detector, may be generated. According to various embodiments of the present disclosure, when a modification is made such that, when the external connector 700 is inserted into the connector 600, an electric conduction between the ground contact 6301 of the connector 600 and the ground contact 7301 of the external connector 700 is performed earlier than an electric conduction between the tongue 620 of the connector 600 and the extension 720 of the external connector 700, the harmful component can be blocked and the malfunction of the external connector detector can be prevented. Alternatively, when a modification is made such that, during the process of inserting the external connector 700 into the connector 600, an electric connection between the ground contact 6301 of the connector 600 and the ground contact 7301 of the external connector 700 is performed earlier than an electric conduction between a power-related contact of the connector 600 and a power-related contact of the external connector 700, the harmful component can be blocked and the malfunction of the external connector detector can be prevented.

According to an embodiment of the present disclosure, the control circuit 403 may include a malfunction prevention circuit. The malfunction prevention circuit can prevent the malfunction of the external connector detector, which may be caused by a harmful component, such as an overcurrent, an overvoltage, a momentary pulse, or noise. The malfunction prevention circuit may include various types of R-C circuits, L-C circuits, or R-L-C circuits.

Referring to FIG. 7, when the external connector 700 is inserted into the second position of the connector 600 of the electronic device or is completely coupled to the connector 600 of the electronic device, the tongue 620, the ground contact 6301, and the power-related contact (e.g., the Vbus contact or the CC contact) 6302 of the connector 600 of the electronic device may be electrically connected to the extension 720, the ground contact 7301, and the power-related contact 7302 of the external connector 700, respectively. According to an embodiment of the present disclosure, the connection between the ground contact 6301 of the connector 600 and the ground contact 7301 of the external connector 700 may be unintentionally released due to the deterioration, fracture, or the like of the connector 600 and/or the external connector 700. In such a case, noise, which interferes with the external connector detector, may be generated due to a power flow between the power-related contact 6302 of the connector 600 and the power-related contact 7302 of the external connector 700. When the malfunction prevention circuit is provided to the control circuit 403, noise can be blocked and the malfunction of the external connector detector can be prevented.

Figure 8:
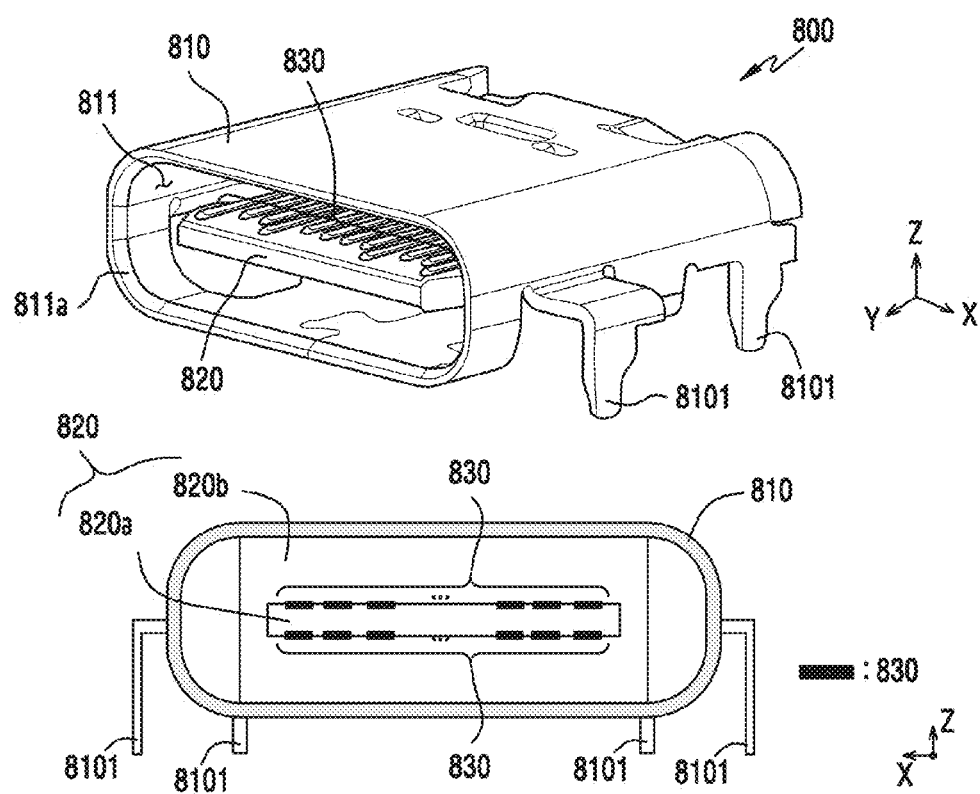
FIG. 8 illustrates a receptacle according to various embodiments of the present disclosure.

FIG. 8 illustrates a receptacle according to various embodiments of the present disclosure.

Figure 9:
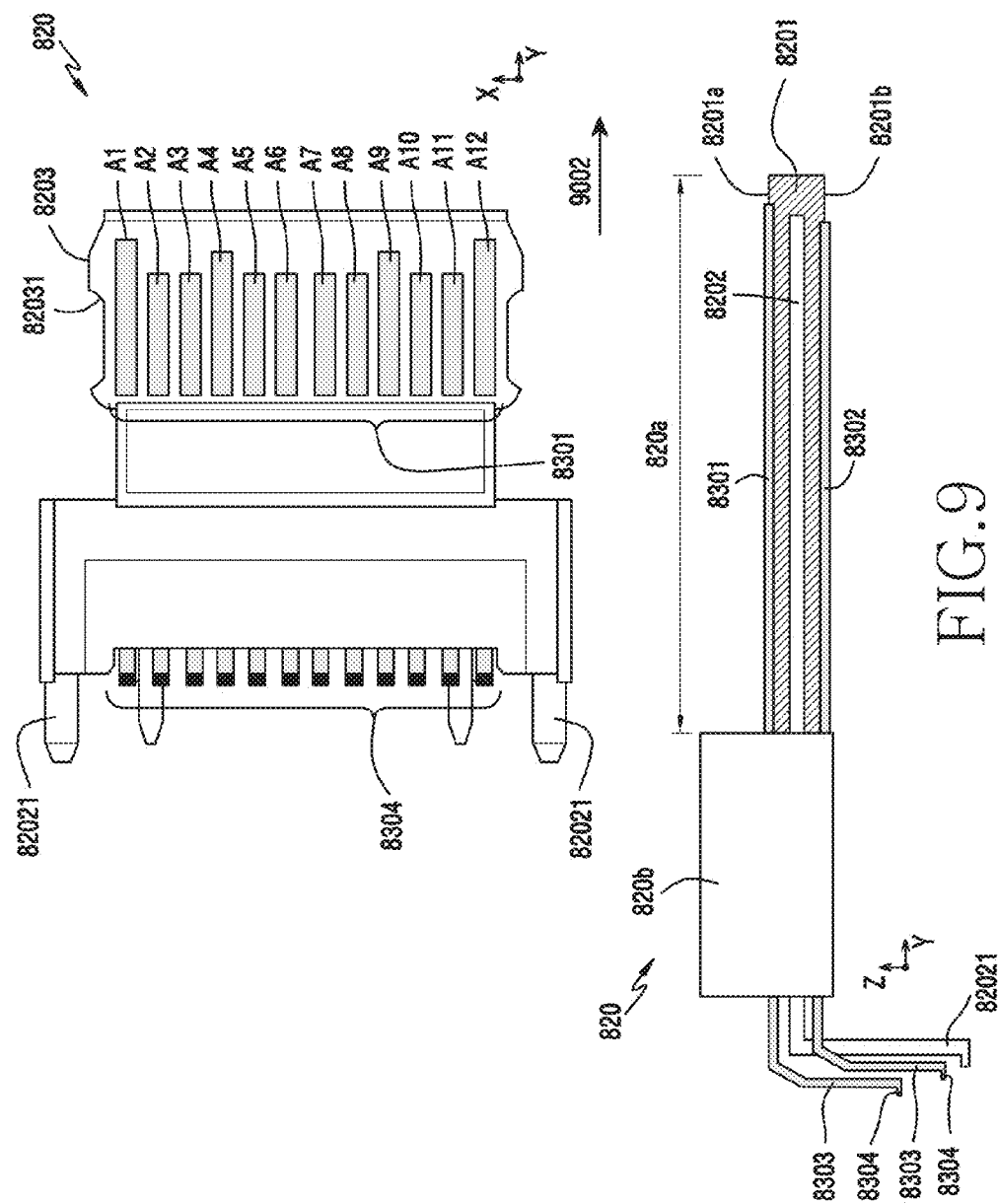
FIG. 9 illustrates a structure of a tongue and a plurality of contacts of a receptacle according to various embodiments of the present disclosure.

FIG. 9 illustrates a structure of a tongue and a plurality of contacts of a receptacle according to various embodiments of the present disclosure.

FIG. 10 illustrates a contact map of a receptacle according to various embodiments of the present disclosure.

Figure 11:
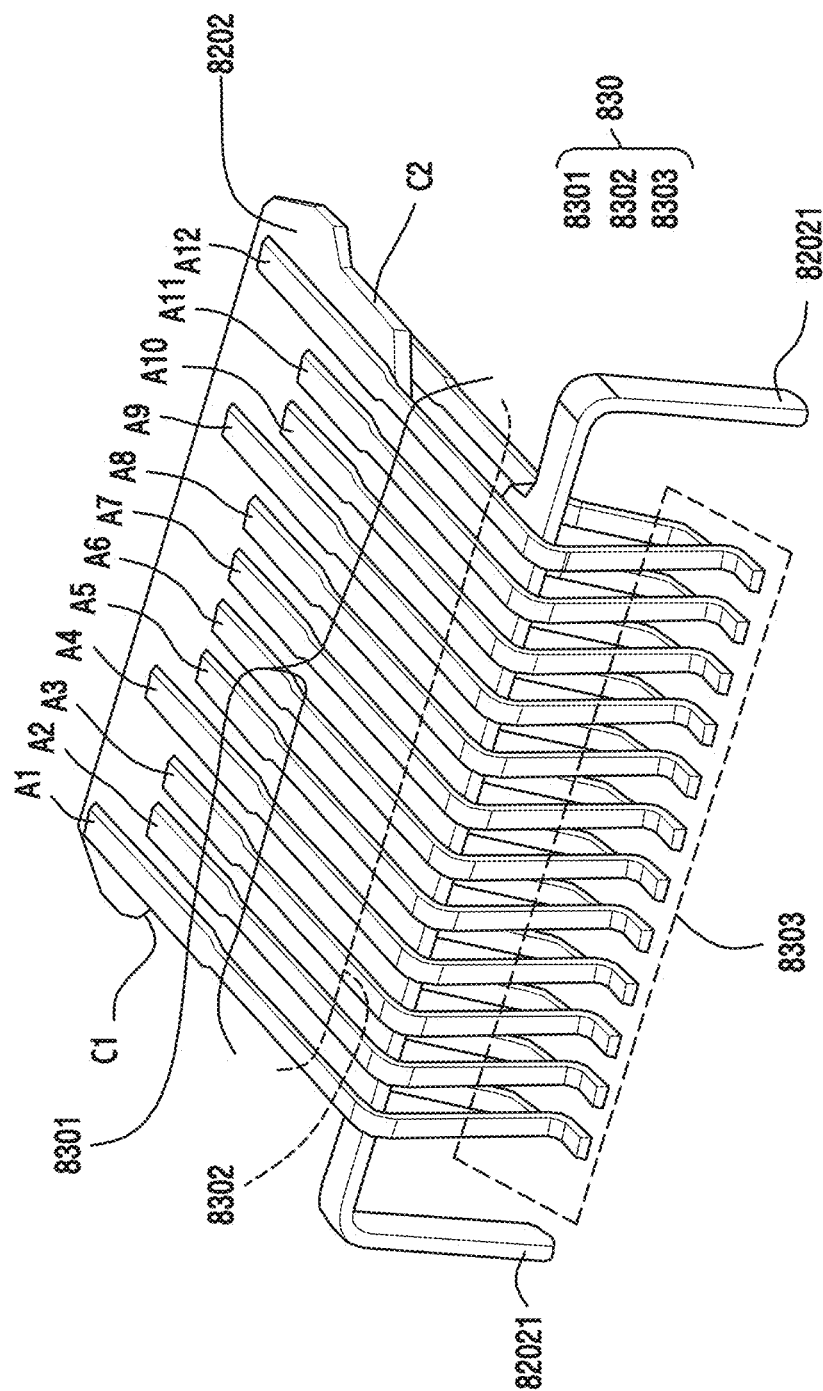
FIG. 11 illustrates a plurality of contacts and a mid-plate of a receptacle according to various embodiments of the present disclosure.

FIG. 11 illustrates a plurality of contacts and a mid-plate of a receptacle according to various embodiments of the present disclosure.

Figure 12:
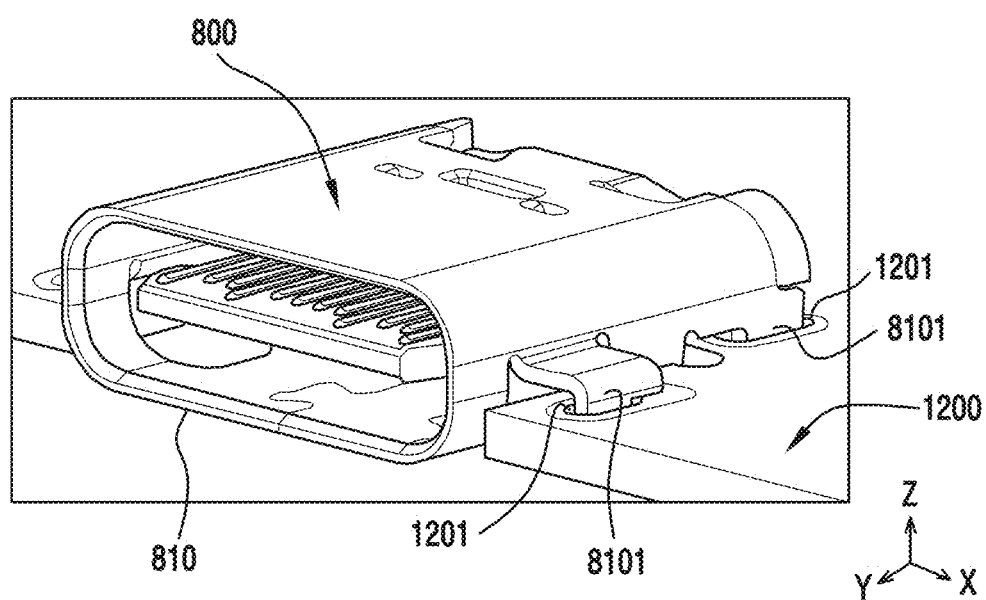
FIG. 12 illustrates a coupling of a receptacle and a circuit board according to various embodiments of the present disclosure.

FIG. 12 illustrates a coupling of a receptacle and a circuit board according to various embodiments of the present disclosure.

Figure 13:
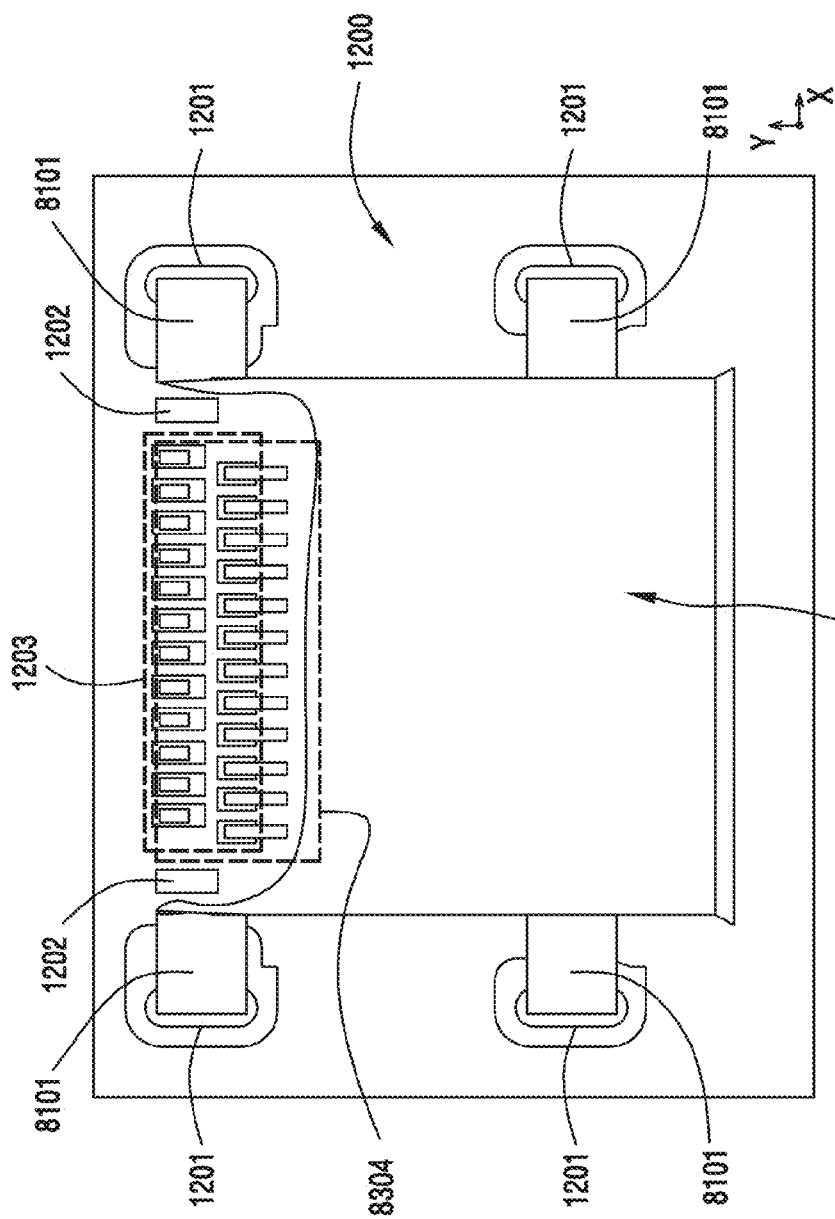
FIG. 13 illustrates a part of a receptacle and a circuit board in a coupled state thereof according to various embodiments of the present disclosure.

FIG. 13 illustrates a part of a receptacle and a circuit board in a coupled state thereof according to various embodiments of the present disclosure.

Referring to FIGS. 8, 9, and 11, a receptacle 800 may include a shell 810, a tongue 820, and a plurality of contacts 830.

According to an embodiment of the present disclosure, the shell 810 has a substantially tubular shape in a form where one side is opened, and may include a passage 811 into which a plug (e.g., the external connector 500 of FIG. 4) can be inserted. An opening 811a is formed at one side of the passage 811, and the plug may be moved into the passage 811 of the shell 810 through the opening 811a. The passage 811 of the shell 810 may extend straight in the movement direction of the plug, and the plug may be guided to the passage 811 of the shell 810 to be at least partially inserted into the shell 810.

According to an embodiment of the present disclosure, at least a portion of the shell 810 may contain a conductive material (e.g., stainless steel or phosphor bronze) or a non-conductive material.

According to an embodiment of the present disclosure, the shell 810 may include a plurality of leads 8101 in a shape of protruding outwardly. The plurality of leads 8101 may be used for coupling the receptacle 800 to a non-illustrated circuit board (e.g., a printed circuit board (PCB)). Referring to FIG. 12, the plurality of leads 8101 may be inserted into a plurality of component holes 1201 of a circuit board 1200, respectively, such that the ends thereof protrude to the opposite side of the circuit board 1200. The circuit board 1200 may include a soldering land (e.g., a copper film pad) (not illustrated) around each of the plurality of component holes 1201. The ends of the plurality of leads 8101 may be coupled to the lands of the circuit board 1200, respectively, by using soldering.

According to an embodiment of the present disclosure, the shell 810 may be electrically connected to the circuit board 1200 through the plurality of leads 8101. For example, the shell 810 may be electrically connected to a ground of the circuit board 1200 through the plurality of leads 8101.

According to an embodiment of the present disclosure, the tongue 820 may include a shape in which the tongue 820 is disposed within the passage 811 of the shell 810 as if a human tongue is disposed within a mouth. For example, the tongue 820 may include a fixing part 820b coupled to the shell 810 and an extension 820a coupled to the fixing part 820b. The extension 820a has a substantially plate-like shape, of which one end may be fixed to the fixing part 820b and the other end may be free.

According to an embodiment of the present disclosure, the tongue 820 may include a base plate 8201 formed of a non-conductive material (e.g., glass-filled nylon), and a mid-plate 8202 disposed inside the base plate 8201. The base plate 8201 may be molded using a non-conductive material, and the plurality of contacts 830 may be arranged on the base plate 8201.

According to an embodiment of the present disclosure, at least a portion of the mid-plate 8202 may contain a conductive material or a non-conductive material. For example, the mid-plate 8202 may include a conductive portion and a non-conductive portion.

According to an embodiment of the present disclosure, the conductive portion of the mid-plate 8202 may be electrically connected to the circuit board (e.g., the circuit board 1200 of FIG. 12). For example, the mid-plate 8202 may include one or more leads 82021 that extend from the tongue 820.

Referring to, for example, FIG. 13, the leads 82021 extend to the outside of the shell 810, and may be electrically connected to lands 1202 provided on the circuit board 1200 using soldering.

According to an embodiment of the present disclosure, the conductive portion of the mid-plate 8202 may be electrically connected to the control circuit of the electronic device (e.g., the control circuit 403 of FIG. 4). For example, the conductive portion of the mid-plate 8202 and at least a portion of the control circuit using the same may be configured as the external connector detector described above with reference to FIGS. 4 and 5.

According to various embodiments of the present disclosure, the conductive portion of the mid-plate 8202 may be electrically connected to the ground member of the electronic device (e.g., the ground of the circuit board 1200 of FIG. 12).

According to an embodiment of the present disclosure, each of the plurality of contacts 830 may include first contact sections 8301 and 8302 and a second contact section 8303. The first contact sections 8301 and 8302 may be disposed on the tongue 820 (e.g., the base plate 8201). The second contact section 8303 may extend from the first contact sections 8301 and 8302, and an end of the second contact section 8303 may include a tail 8304 used for electric connection to the circuit board (e.g., the circuit board 1200 of FIG. 13).

Referring to, for example, FIG. 13, the tail 8304 may be electrically connected to a land 1203 provided on the circuit board 1200 using soldering.

According to an embodiment of the present disclosure, one of the first contact sections 8301 and 8302 of the plurality of contacts 830 may include an elastic portion (not illustrated) in a bent form. When the receptacle 800 and the plug (e.g., the external connector 500 of FIG. 4) are coupled to each other, the elastic portions may reduce poor contact between the first contact sections 8301 and 8302 of the plurality of contacts 830 and the contacts of the plug.

According to an embodiment of the present disclosure, the plug (e.g., the external connector 500 of FIG. 4) may be inserted into the receptacle 800 irrespective of the top and bottom. Alternatively, even if the plug is inserted into the receptacle 800 irrespective of the top and bottom, a correct electric connection can be formed between the plug and the receptacle 800. According to an embodiment of the present disclosure, the receptacle 800 and the plug may include a C-type connector or a reversible connector.

According to an embodiment of the present disclosure, the base plate 8201 has a plate-like shape having a substantially constant thickness, and may include a first face 8201a and a second face 8201b that face in opposite directions. The receptacle 800 may be a C-type connector, some of the first contact sections 8301 (hereinafter, 1-1th contact sections) may be arranged on the first face 8021a of the base plate 8201, and the remaining first contact sections 8302 (hereinafter, 1-$2^{nd}$ contact sections) may be arranged on the second face 8201b of the base plate 8201. Referring to, for example, FIG. 11, a portion of the mid-plate 8202 may be disposed between the 1-$1^{th}$ contact sections 8301 and the 1-$2^{nd}$ contact sections 8302.

Referring to FIGS. 9 and 11, the tongue 820 of the receptacle 800 may include a hook fastening portion 82031, to which the hook of the plug (the external connector 500 of FIG. 4) can be fastened. When viewed in a plan view, the hook fastening portion 82031 is formed on a side face 8203 of the tongue 820, and may include a latch operation that prevents the hook of the plug from being released in the separation direction of the plug.

According to an embodiment of the present disclosure, FIG. 10 illustrates a contact map of a USB C-type receptacle 800. The term "contact" may be replaced by "pin" or "terminal."

Referring to FIG. 10, the plurality of contacts 830 of the receptacle 800 may include A contacts A1 to A12 and B contacts B1 to B12. According to an embodiment of the present disclosure, the A contacts and the B contacts may be arranged to be symmetric to each other. For example, ground contacts A1 and A12, contacts A2, A3, A10, and A11 that support high speed transmission of digital data, contacts A4 and A9 that support power supply, a CC contact A5, an SBU contact A8, and contacts A6 and A7 that support low speed data transmission may be arranged to be symmetric to ground contacts B1 and B12, contacts B2, B3, B10, and B11 that support high speed transmission of digital data, contacts B4 and B9 that support power supply, a CC contact B5, an SBU contacts B8, and contacts B6 and B7 that support low speed data transmission, respectively. According to an embodiment of the present disclosure, as the A contacts and the B contacts are arranged to be symmetric to each other, the receptacle 800 can transmit/receive a correct signal irrespective of the direction of the plug inserted into the receptacle 800.

According to an embodiment of the present disclosure, the plurality of contacts 830 of the receptacle 800 may include C contacts C1 and C2. For example, the A contacts and the B contacts may be disposed between a pair of C contacts C1 and C2.

According to an embodiment of the present disclosure, the C contacts C1 and C2 may be formed on a side face 8203 of the tongue (e.g., the tongue 820 of FIG. 9). For example, the C contacts C1 and C2 may be formed by the conductive portion of the mid-plate (the mid-plate 8202 in FIGS. 9 and 11).

Referring to FIGS. 9 and 10, at least some of the plurality of contacts 830 may be designed to protrude more than the other ones in a plug separation direction 9002. For example, at least some of the plurality of contacts 830 may have a length that extends more than the other ones in the plug separation direction 9002. According to an embodiment of the present disclosure, when the receptacle 800 and the plug are coupled to each other, electricity may be conducted first to some of the contacts 830, which relatively protrude more, among the plurality of contacts 830 of the receptacle 800.

According to an embodiment of the present disclosure, the ground contacts A1 and A12 and B1 and B12 of the receptacle 800 may be designed to protrude more than the other contacts in the plug separation direction 9002. For example, the ground contacts A1 and A12 and B1 and B12 may have a length that extends more than the contacts A4 and A9 and B4 and B9 that support power supply in the plug separation direction 9002. Alternatively, the ground contacts A1 and A12 and B1 and B12 may have a length that extends more than the contacts to which power may be applied (e.g., CC contacts A5 and B5) in the plug separation direction 9002.

According to an embodiment of the present disclosure, when the plug (e.g., the external connector 500 of FIG. 4) is inserted into the receptacle 800, the ground contacts A1 and A12 and B1 and B12 of the receptacle 800 may be electrically conducted to the plug earlier than the other contacts. For example, when the plug (e.g., the external connector 500 of FIG. 4) is inserted into the receptacle 800, the ground contacts A1 and A12 and B1 and B12 of the receptacle 800 may be electrically conducted to the plug earlier than the mid-plate 820 of the receptacle 800. This may prevent the malfunction of a circuit that performs various operation flows by using an electric connection between the mid-plate 820 of the receptacle 800 and the plug.

Figure 14:
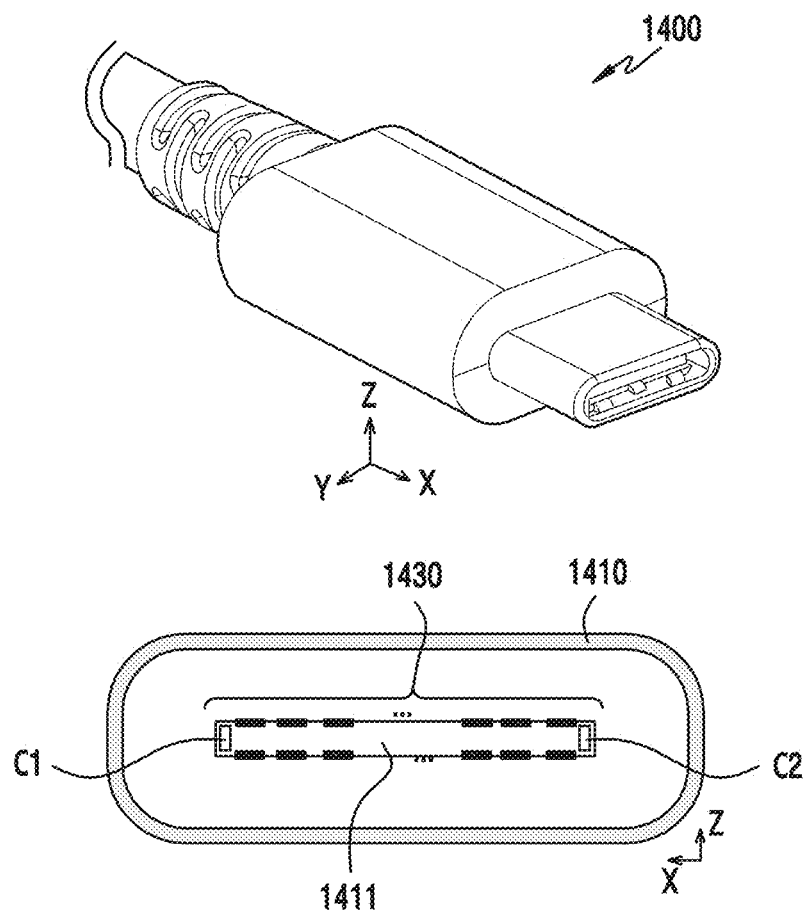
FIG. 14 illustrates a plug according to various embodiments of the present disclosure.

FIG. 14 illustrates a plug according to various embodiments of the present disclosure.

Figure 15:
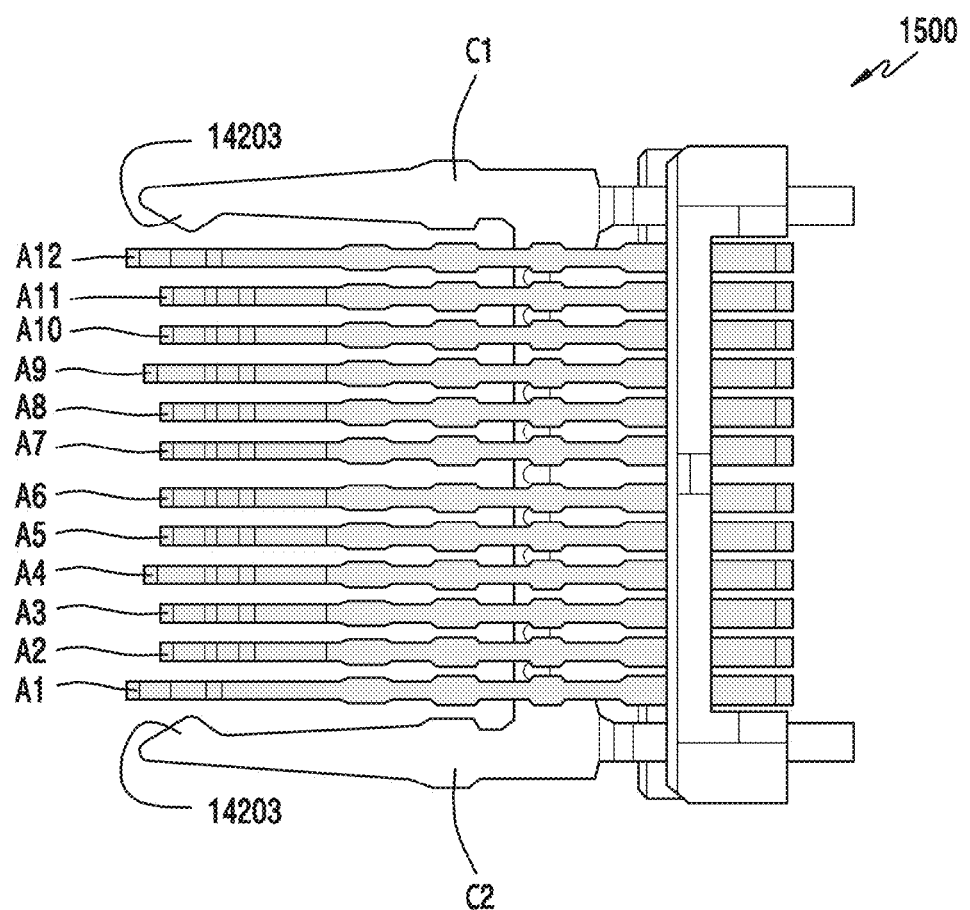
FIG. 15 illustrates a structure of a plurality of contacts of a plug according to various embodiments of the present disclosure.

FIG. 15 illustrates a structure of a plurality of contacts of a plug according to various embodiments of the present disclosure.

FIG. 16 illustrates a contact map of a plug according to various embodiments of the present disclosure.

Referring to FIG. 14, according to an embodiment of the present disclosure, a plug 1400 may include a shell 1410 and a plurality of contacts 1430. The shell 1410 may have an appearance to be fitted to the passage 811 of the shell 810 of the receptacle (e.g., the receptacle 800 of FIG. 8).

According to an embodiment of the present disclosure, the shell 1410 may include a slot 1411 opened at one side. The plurality of contacts 1430 may be disposed within the slot 1411. For example, when the receptacle (e.g., the receptacle 800 of FIG. 8) and the plug 1400 are coupled to each other, the shell 1410 may be inserted into the passage 811 of the shell 810 of the receptacle 800, and the tongue 820 of the receptacle 800 may be inserted into the slot 1411. When the tongue 820 of the receptacle 800 is inserted into the slot 1411, the plurality of contacts 830 disposed in the tongue 820 of the receptacle 800 may be electrically connected to the plurality of contacts 1430 disposed in the slot 1411.

According to an embodiment of the present disclosure, the plug 1400 is a C-type connector, and the plurality of contacts 1430 of the plug 1400 may be arranged in the slot 1411 to correspond to the first contact sections 8301 and 8302 of the receptacle (e.g., the receptacle 800 of FIG. 8).

According to an embodiment of the present disclosure, the plug 1400 may include contacts C1 and C2 (e.g., the extension 520 of FIG. 5) electrically connected to the mid-plate (e.g., the mid-plate 820 of FIG. 8) of the receptacle.

According to an embodiment of the present disclosure, FIG. 15 illustrates a contact structure 1500 of a USB C-type plug (e.g., the plug 1400 of FIG. 14), and FIG. 16 illustrates a contact map of the USB C-type plug 1400.

Referring to FIGS. 15 and 16, the plurality of contacts 1430 of the receptacle 1400 may include A contacts A1 to A12 and B contacts B1 to B12. According to an embodiment of the present disclosure, the A contacts and the B contacts may be arranged to be symmetric to each other. For example, ground contacts A1 and A12, contacts A2, A3, A10, and A11 that support high speed transmission of digital data, contacts A4 and A9 that support power supply, a CC contact A5, an SBU contacts A8, and contacts A6 and A7 that support low speed data transmission may be arranged to be symmetric to ground contacts B1 and B12, contacts B2, B3, B10, and B11 that support the high speed transmission of digital data, contacts B4 and B9 that support power supply, a Vconn contact B5, an SBU B8, and contacts B6 and B7 that support low speed data transmission, respectively. In an embodiment of the present disclosure, as the A contacts and the B contacts are arranged to be symmetric to each other, when the plug 1400 is inserted into the receptacle (e.g., the receptacle 800 of FIG. 8), a correct electric connection can be formed between the plug 1400 and the receptacle irrespective of the insertion direction of the plug 1400.

Referring to FIG. 16, the plurality of contacts 1430 of the plug 1400 may include C contacts C1 and C2. For example, the A contacts and the B contacts may be disposed between a pair of C contacts C1 and C2.

According to an embodiment of the present disclosure, the C contacts C1 and C2 may be used for a physical fastening and electric connection between the receptacle (e.g., the receptacle 800 of FIG. 8) and the plug 1400. For example, the C contacts C1 and C2 may be fixed at one end and may be free at the other end like a cantilever. The free end of each of the C contacts C1 and C2 may include a hook 14203 for snap-fit fastening. For example, when the plug 1400 is inserted into the receptacle (e.g., the receptacle 800 of FIG. 8), the C-contacts C1 and C2 may be fastened to the hook fastening portion (e.g., the hook fastening portion 82031 of FIG. 9) of the receptacle 800 through an elastic flexural deformation, and may be electrically connected to the C contacts (the contacts C1 and C2 in FIG. 9) of the receptacle 800.

Figure 17:
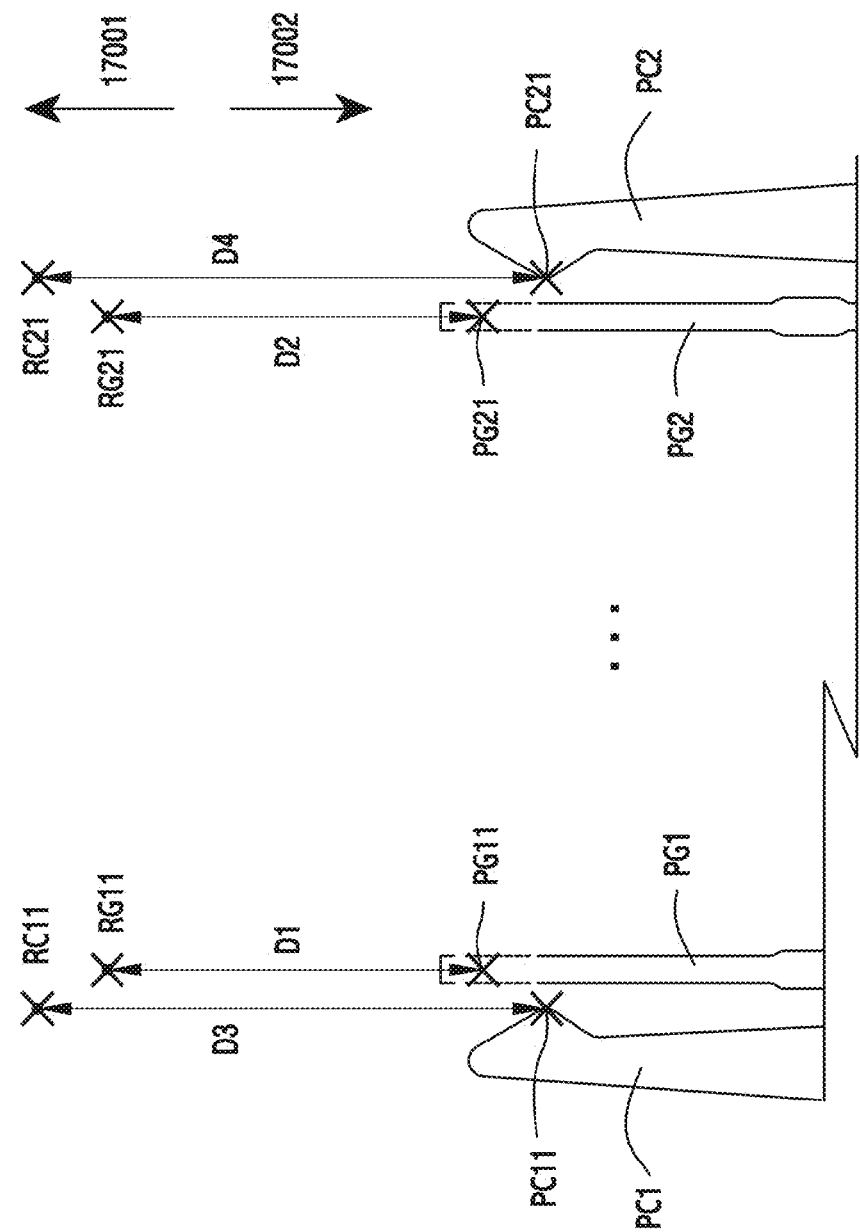
FIG. 17 illustrates an electric conduction point of a plug and a receptacle according to various embodiments of the present disclosure.

FIG. 17 illustrates an electric conduction point of a plug and a receptacle according to various embodiments of the present disclosure.

Figure 18:
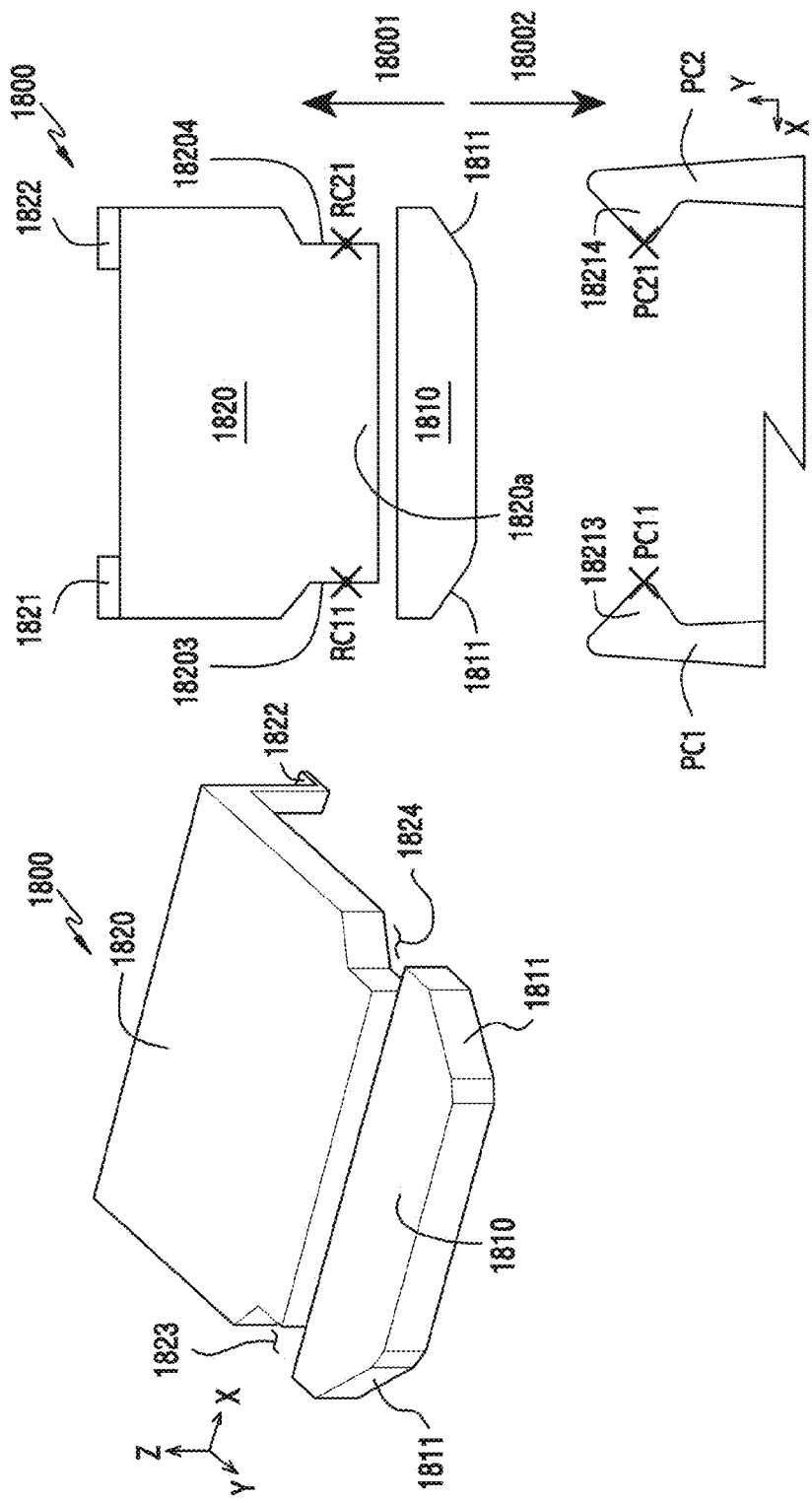
FIGS. 18 to 20 illustrate mid-plates of a receptacle according to various embodiments of the present disclosure.
Figure 19:
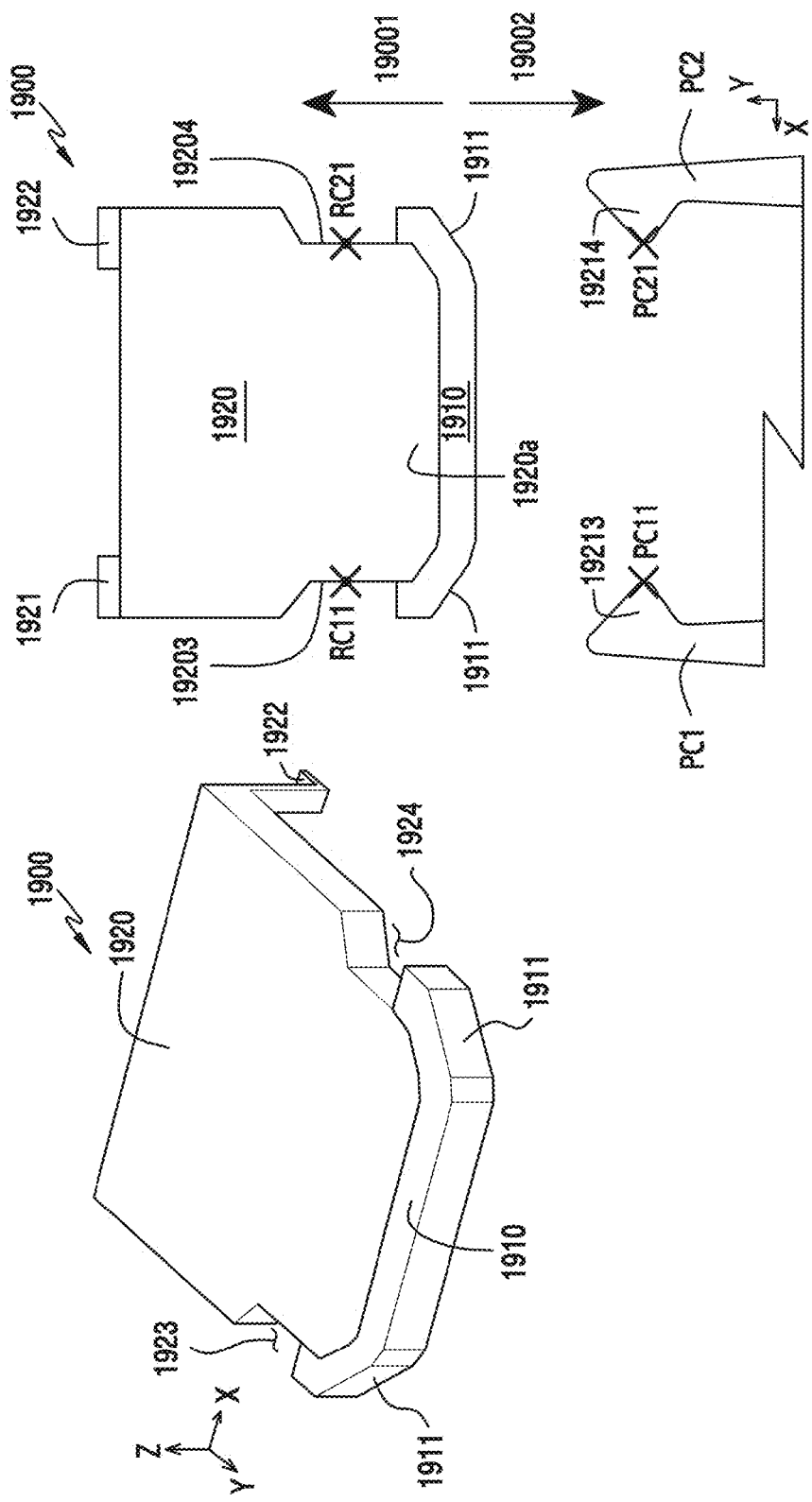
Figure 20:
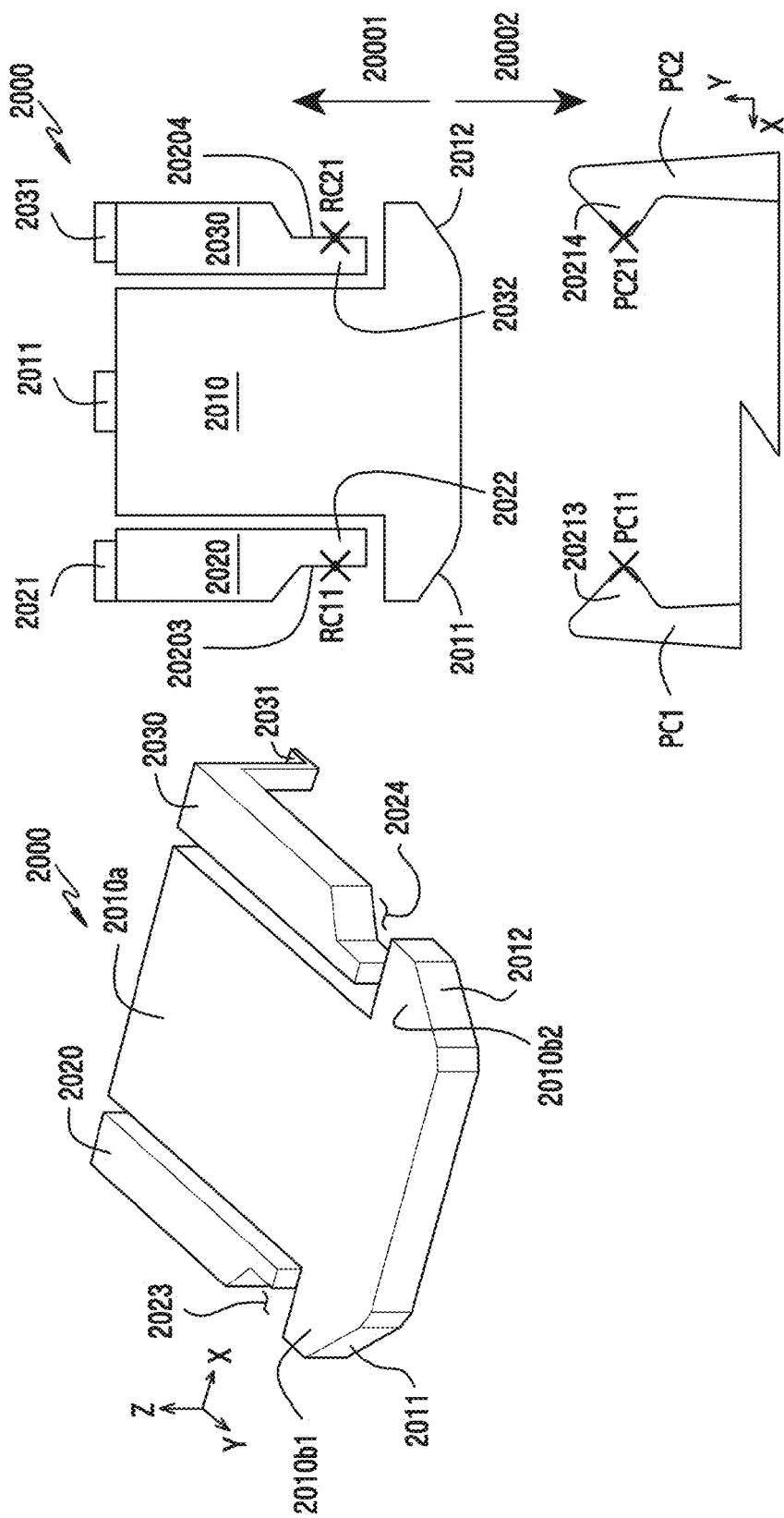

FIGS. 18 to 20 illustrate mid-plates of a receptacle according to various embodiments of the present disclosure.

According to an embodiment of the present disclosure, when the plug (e.g., the plug 1400 of FIG. 14) is inserted into the receptacle (e.g., the receptacle 800 of FIG. 8), the ground contacts of the plug PG1 and PG2 (e.g., the contacts A1 and A12 and contacts B1 and B12 of FIG. 15) may be electrically connected to the receptacle earlier than the C contacts PC1 and PC2 of the plug (e.g., the contacts C1 and C2 of FIG. 10 or the extension 520 of FIG. 5).

Referring to FIG. 17, according to an embodiment of the present disclosure, when viewed in a plug insertion direction 17001, the distances D1 and D2 between electric conduction points RG11 and RG21 of the ground contacts (e.g., the contacts A1 and A12 and the contacts B1 and B12) of the receptacle and the electric conduction points PG11 and PG21 of the ground contacts PG1 and PG2 of the plug may be smaller than the distances D3 and D4 between the electric conduction points RC11 and RC21 of the C contacts (e.g., the contacts C1 and C2 of FIG. 10) of the receptacle and the electric conduction points PC11 and PC21 of the C contacts PC1 and PC2 of the plug. The electric conduction points RG11, RG21, RC11, and RC21 of the receptacle may refer to the points where the electric conduction points PG11, PG21, PC11, and PC21 of the plug are initially electrically conducted to the receptacle when the plug is inserted into the receptacle. For example, the electric conduction points RC11 and RC21 of the C-contacts of the receptacle may refer to the points where the electric conduction points PC11 and PC21 of the C contacts of the plug are initially electrically conducted to the external connector detector, which was described above with reference to FIG. 5.

According to an embodiment of the present disclosure, the electric conduction points RG11, RG21, RC11, and RC21 of the receptacle may be disposed at, or adjacent to, the ends of the contacts of the receptacle. For example, the ground contacts (e.g., the ground contacts A1 and A12; B1 and B12 of FIG. 10) may have a length that extends more than the C contacts (e.g., the C contacts C1 and C2 of FIG. 10) in the plug separation direction 17002.

According to an embodiment of the present disclosure, the electric conduction points PG11, PG21, PC11, and PC21 of the plug may be disposed at, or adjacent to, the ends of the contacts of the plug. For example, the ground contacts PG1 and PG2 of the plug may have a length that extends more than the C contacts PC1 and PC2 of the plug in the plug insertion direction 17001.

According to an embodiment of the present disclosure, the electric conduction points PG11 and PC21 of the ground contacts PG1 and PG2 of the plug may be designed not to be disposed farther than the electric conduction points PC11 and PC21 of the C contacts PC1 and PC2 of the plug in the plug insertion direction 17001. For example, since the electric conduction points PC11 and PC21 of the C contacts PC1 and PC2 of the plug are disposed in front of the electric conduction points PG11 and PG21 of the ground contacts PG1 and PG2 of the plug in the plug insertion direction 17001, the electric conduction points PC11 and PC21 of the C contacts PC1 and PC2 of the plug may be first electrically conducted to the receptacle when the plug is inserted into the receptacle. On the contrary, the electric conduction points RG11 and RG21 of the ground contacts of the receptacle may be designed to be disposed farther than the electric conduction points RC11 and RC21 of the C contacts of the receptacle in a plug separation direction 17002.

According to another embodiment of the present disclosure, the electric conduction points PG11 and PC21 of the ground contacts PG1 and PG2 of the plug may be designed to be disposed farther than the electric conduction points PC11 and PC21 of the C contacts PC1 and PC2 of the plug in the plug insertion direction 17001. For example, since the electric conduction points PG11 and PG21 of the ground contacts PG1 and PG2 of the plug is located in front of the electric conduction points PC11 and PC21 of the C contacts PC1 and PC2 of the plug in the plug insertion direction 17001, it is highly probable that the electric conduction points PG11 and PG21 of the ground contacts PG1 and PG2 of the plug are electrically conducted to the receptacle first when the plug is inserted into the receptacle.

Referring to FIG. 18, a mid-plate 1800 of the receptacle (e.g., the mid-plate 8202 of FIG. 5) may include a first part 1810 and a second part 1820. When viewed in the plug insertion direction 18001, the first part 1810 may be located in front of the second part 1820.

According to an embodiment of the present disclosure, the mid-plate 1800 may include one or more tails 1821 and 1822 that extend from the conductive second part 1820. The one or more tails 1821 and 1822 may be electrically connected to the circuit board (e.g., the circuit board 1200 of FIG. 12) of the electronic device.

According to an embodiment of the present disclosure, the second part 1820 has a shape obtained by partially removing opposite corner portions of a rectangular plate when viewed in a plan view, and may include an extension 1820a that protrudes in the plug separation direction 18002 between front opposite empty spaces 1823 and 1824.

According to an embodiment of the present disclosure, the first part 1810 may have a shape extending to cover the front opposite empty spaces 1823 and 1824 of the second part 1820 when viewed in the plug insertion direction 18001. When the first part 1810 and the second part 1820 are coupled to each other, the front opposite empty spaces 1823 and 1824 of the first part 1810 may be formed as recesses opened in a direction orthogonal to the plug insertion direction 18001. The recesses may be used as hook fastening portions 18203 and 18204 to which hooks 18213 and 18234 formed in the free ends of the C contacts PC1 and PC2 of the plug are fastened.

According to an embodiment of the present disclosure, the front opposite portions 1811 and 1812 of the first part 1810 may be formed to be tapered when viewed in the plug insertion direction 18001. When the plug is inserted into the receptacle, the hooks 18213 and 18214 of the C contacts PC1 and PC2 of the plug may come in sliding contact along the faces connected to the hook fastening portions 18203 and 18204 from the tapered front opposite portions 1811 and 1812 of the mid-plate 1800. According to the sliding movement of the hooks 18213 and 18214, the C contacts PC1 and PC2 of the plug may be subjected to elastic flexural deformation (e.g., deflection).

According to an embodiment of the present disclosure, the electric conduction points PC11 and PC21 of the C contacts PC1 and PC2 of the plug may be formed on the hooks 18213 and 18234.

According to an embodiment of the present disclosure, the electric conduction points RC11 and RC21 of the mid-plate 1800 of the receptacle may be points where the electric conduction points PC11 and PC21 of the C contacts PC1 and PC2 of the plug are initially electrically conducted to the above-mentioned external connector detector when the plug is inserted into the receptacle. For example, the electric conduction points RC11 and RC12 of the mid-plate 1800 of the receptacle may be positioned on the hook fastening portions 18203 and 18204, or may be positioned at a portion adjacent to the hook fastening portions 18203 and 18204.

According to an embodiment of the present disclosure, the first part 1810 may be formed of a non-conductive material, and the second part 1820 may be formed of a conductive material. In this case, the electric conduction points RC11 and RC21 of the mid-plate 1800 of the receptacle may be formed on the conductive second part 1820 disposed behind the non-conductive first part 1810 when viewed in the plug insertion direction 18001. This may bring out a result of moving the electric conduction points RC11 and RC21 of the mid-plate 1800 of the receptacle farther in the plug insertion direction 18001, and may enable a design that causes the electric conduction points PC11 and PC21 of the C contacts PC1 and PC2 of the plug to be electrically conducted to the receptacle later than the ground contacts (the ground contacts PG1 and PG2 of FIG. 17) of the plug when the plug is inserted into the receptacle.

Referring to FIG. 19, a mid-plate 1900 (e.g., the mid-plate 8202 of FIG. 5) of a receptacle may include a first part 1910 and a second part 1920. When viewed in the plug insertion direction 19001, the first part 1910 may be located in front of the second part 1920.

According to an embodiment of the present disclosure, the mid-plate 1900 may include one or more tails 1921 and 1922 that extend from the conductive second part 1920. The one or more tails 1921 and 1922 may be electrically connected to the circuit board (e.g., the circuit board 1200 of FIG. 12) of the electronic device.

According to an embodiment of the present disclosure, the second part 1920 has a shape obtained by partially removing opposite corner portions of a rectangular plate when viewed in a plan view, and may include an extension 1920a that protrudes in the plug separation direction 19002 between front opposite empty spaces 1923 and 1924.

According to an embodiment of the present disclosure, the first part 1910 may have a shape extending to cover the front opposite empty spaces 1923 and 1924 of the second part 1920 when viewed in the plug insertion direction 19001. For example, when viewed in a plan view, the first part 1910 may have a shape recessed in the plug insertion direction 19001, and may cover the front portion of the extension 1920a of the second part 1920. When the first part 1910 and the second part 1920 are coupled to each other, the front opposite empty spaces 1923 and 1924 of the first part 1910 may be formed as recesses opened in a direction orthogonal to the plug insertion direction 19001. The recesses may be used as hook fastening portions 19203 and 19204 to which hooks 19213 and 19214 formed in the free ends of the C contacts PC1 and PC2 of the plug are fastened.

According to an embodiment of the present disclosure, the front opposite portions 1911 and 1912 of the first part 1910 may be formed to be tapered when viewed in the plug insertion direction 19001. When the plug is inserted into the receptacle, the hooks 19213 and 19214 of the C contacts PC1 and PC2 of the plug may come in sliding contact along the faces connected to the hook fastening portions 19203 and 19204 from the tapered front opposite portions 1911 and 1912 of the mid-plate 1800.

According to an embodiment of the present disclosure, the electric conduction points PC11 and PC21 of the C contacts PC1 and PC2 of the plug may be formed on the hooks 19213 and 19214.

According to an embodiment of the present disclosure, the electric conduction points RC11 and RC21 of the mid-plate 1900 of the receptacle may be points where the electric conduction points PC11 and PC21 of the C contacts PC1 and PC2 of the plug are initially electrically conducted to the above-mentioned external connector detector when the plug is inserted into the receptacle. For example, the electric conduction points RC11 and RC21 of the mid-plate 1900 of the receptacle may be positioned on the hook fastening portions 19203 and 19204 or may be positioned at a portion adjacent to the hook fastening portions 19203 and 19204.

According to an embodiment of the present disclosure, the first part 1910 may be formed of a non-conductive material, and the second part 1920 may be formed of a conductive material. In this case, the electric conduction points RC11 and RC21 of the mid-plate 1900 of the receptacle may be formed on the conductive second part 1920 disposed behind the non-conductive first part 1910 when viewed in the plug insertion direction 19001. This may result in moving the electric conduction points RC11 and RC21 of the mid-plate 1900 of the receptacle farther in the plug insertion direction 19001, and may enable a design that causes the electric conduction points PC11 and PC21 of the C contacts PC1 and PC2 of the plug to be electrically conducted to the receptacle later than the ground contacts (the ground contacts PG1 and PG2 of FIG. 17) of the plug when the plug is inserted into the receptacle.

Referring to FIG. 20, a mid-plate 2000 (e.g., the mid-plate 8202 of FIG. 5) of the receptacle may include a first part 2010, a second part 2020, and a third part 2030. The first part 2010 may be disposed between the second part 2020 and the third part 2030 when viewed in a plan view.

According to an embodiment of the present disclosure, the first part 2010 may be substantially T-shaped. For example, the first part 2010 has a shape obtained by partially removing opposite corner portions of a rectangular plate when viewed in a plan view, and may include an extension 2010a that protrudes in the plug insertion direction 20001 between rear opposite empty spaces 2023 and 2024. The first part 2010 may include opposite extensions 2010b1 and 2010b2 that cover the rear opposite empty spaces 2023 and 2024 when viewed in the plug insertion direction 20001.

According to an embodiment of the present disclosure, the rear opposite empty spaces 2023 and 2024 of the first part 2010 may have a rectangular shape extending substantially in the plug insertion direction 20001.

According to an embodiment of the present disclosure, the second part 2020 and the third part 2030 may be disposed in the rear opposite empty spaces 2023 and 2024 of the first part 2010, respectively. When viewed in a plan view, the second part 2020 and the third part 2030 may have a rectangular shape extending substantially in the plug insertion direction 20001, and may occupy a part of the rear opposite empty spaces 2023 and 2024 of the first part 2010. When the first part 2010 and the second part 2020 are coupled to each other, the space that is not occupied by the second part 2020 in one empty space 2023 of the first part 2010 may formed as a recess opened in a direction orthogonal to the plug insertion direction 20001. When the first part 2010 and the third part 2030 are coupled to each other, the space that is not occupied by the third part 2030 in the other empty space 2024 of the first part 2010 may be formed as a recess opened in a direction orthogonal to the plug insertion direction 20001. The recesses may be used as hook fastening portions 20203 and 20204 to which hooks 20213 and 20214 formed in the free ends of the C contacts PC1 and PC2 of the plug are fastened.

According to an embodiment of the present disclosure, the second part 2020 may include a lip 2022 protruding in the plug separation direction 20002. An electric conduction point RC11 of the second part 2020 may be formed on the lip 2022, and may be electrically connected to the electric conduction point PC11 of the hook 20213 fastened to the hook fastening portion 20203. The third part 2030 may include a lip 2032 including an electric conduction point RC21 like the second part 2020.

According to an embodiment of the present disclosure, the front opposite portions 2011 and 2012 of the first part 2010 may be formed to be tapered when viewed in the plug insertion direction 20001. When the plug is inserted into the receptacle, the hooks 20213 and 20214 of the C contacts PC1 and PC2 of the plug may come in sliding contact along the faces connected to the hook fastening portions 20203 and 20204 from the tapered front opposite portions 2011 and 2012 of the mid-plate 2000.

According to an embodiment of the present disclosure, at least one of the first part 2010, the second part 2020, and the third part 2030 of the mid-plate 2000 may be formed of a conductive material. Alternatively, the first part 2010 may contain a non-conductive material.

According to an embodiment of the present disclosure, the second part 2020 and/or the third part 2030 may be formed of a conductive material, and the mid-plate 2000 may include one or more tails 2021 and 2031 that extend from the conductive second part 2020 and/or third part 2030. The one or more tails 2021 and 2031 may be electrically connected to the circuit board (e.g., the circuit board 1200 of FIG. 12) of the electronic device. For example, the second part 2020 and/or the third part 2030 may be used as a part of the external connector detector described above with reference to FIG. 5.

According to an embodiment of the present disclosure, the first part 2010 may be formed of a conductive material. The first part 2010 may be formed in an electrically floating state.

According to another embodiment of the present disclosure, the first part 2010 may be formed of a conductive material, and the mid-plate 2000 may include at least one tail 2011 that extends from the conductive first part 2010. The at least one tail 2011 may be electrically connected to the circuit board (e.g., the circuit board 1200 of FIG. 12) of the electronic device. According to an embodiment of the present disclosure, the at least one tail 2011 may be electrically connected to the ground of the circuit board. For example, the first part 2010 is used as a part of the ground of the electronic device, which may serve to reduce a harmful component (e.g., noise) that enters into the above-mentioned external connector detector.

According to an embodiment of the present disclosure, the first part 2010 may be formed of a non-conductive material, and the second part 2020 and the third part 2030 may be formed of a conductive material. When the plug is inserted into the receptacle, the electric conduction points PC11 and PC21 formed on the hooks 20213 and 20214 of the plug come in contact with the extensions 2010b1 and 2010b2 of the non-conductive first part 2010. However, the electric conduction points RC11 and RC21 of the mid-plate 2000 of the receptacle may not be formed on the extensions 2010b1 and 2010b2 of the first part 2010, but may be formed on the second part 2020 and the third part 2030 (e.g., the lips 2022 and 2032). The electric conduction points RC11 and RC21 of the mid-plate 2000 of the receptacle are disposed behind the extensions 2010b1 and 2010b2 of the first portion 2010 of the plug, which may enable a design that causes the contact points PC11 and PC21 of the C contacts PC1 and PC2 of the plug to be electrically conducted to the receptacle later than the ground contacts (the ground contacts PG1 and PG2 of FIG. 17) of the plug when the plug is inserted into the receptacle.

According to another embodiment of the present disclosure, all the first part 2010, the second part 2020, and the third part 2030 may be formed of a conductive material. For example, when the plug is inserted into the first position of the receptacle, the electric conduction points PC11 and PC21 of the hooks 20213 and 20214 of the plug may be electrically connected to the extensions 2010b1 and 2010b2 of the conductive first part 2010. As described above, the first part 2010 may be electrically connected to the circuit board (e.g., the circuit board 1200 of FIG. 12) through the tail 2011, and may be used as a ground of the external device (e.g., the external device 501 of FIG. 4) and/or the electronic device (e.g., the electronic device 401 of FIG. 4). The C contacts PC1 and PC2 of the plug may be electrically connected to the circuit board through the first part 2010, and may be used as a ground of the external device and/or the electronic device. Alternatively, the first part 2010 may be in an electrically floating state. The first part 2010 may be electrically connected to the external device (e.g., the external device 501 of FIG. 4) through the C contacts PC1 and PC2 of the plug, and may be used as a ground of the external device (e.g., the external device 501 of FIG. 4) and/or the electronic device (e.g., the electronic device 401 of FIG. 4). As another example, when the plug is inserted into the second position of the receptacle, the electric conduction points PC11 and PC21 of the hooks 20213 and 20214 of the plug may be electrically connected to the conductive second part 2020 and third part 2030 without being electrically connected to the conductive first part 2010. The conductive second part 2020 and third part 2030 may be used as a part of the above-mentioned external connector detector, and electric conduction points RC11 and RC21 for the external connector detector may be formed on the second part 2020 (e.g., the lip 2022) and the third part 2030 (e.g., the lip 2032). Because the electric conduction points RC11 and RC21 on the mid-plate 2000 for the external connector detector are disposed behind the extensions 2010b1 and 2010b2 of the first part 2010, it is possible to enhance the likelihood that the contact points PC11 and PC21 of the C contacts PC1 and PC2 of the plug to be electrically connected to the receptacle later than the ground contacts (the ground contacts PG1 and PG2 of FIG. 17) of the plug when the plug is inserted into the receptacle.

FIGS. 21 to 24 illustrate connection structures between a receptacle and a plug, and circuits thereof according to various embodiments of the present disclosure.

Figure 21:
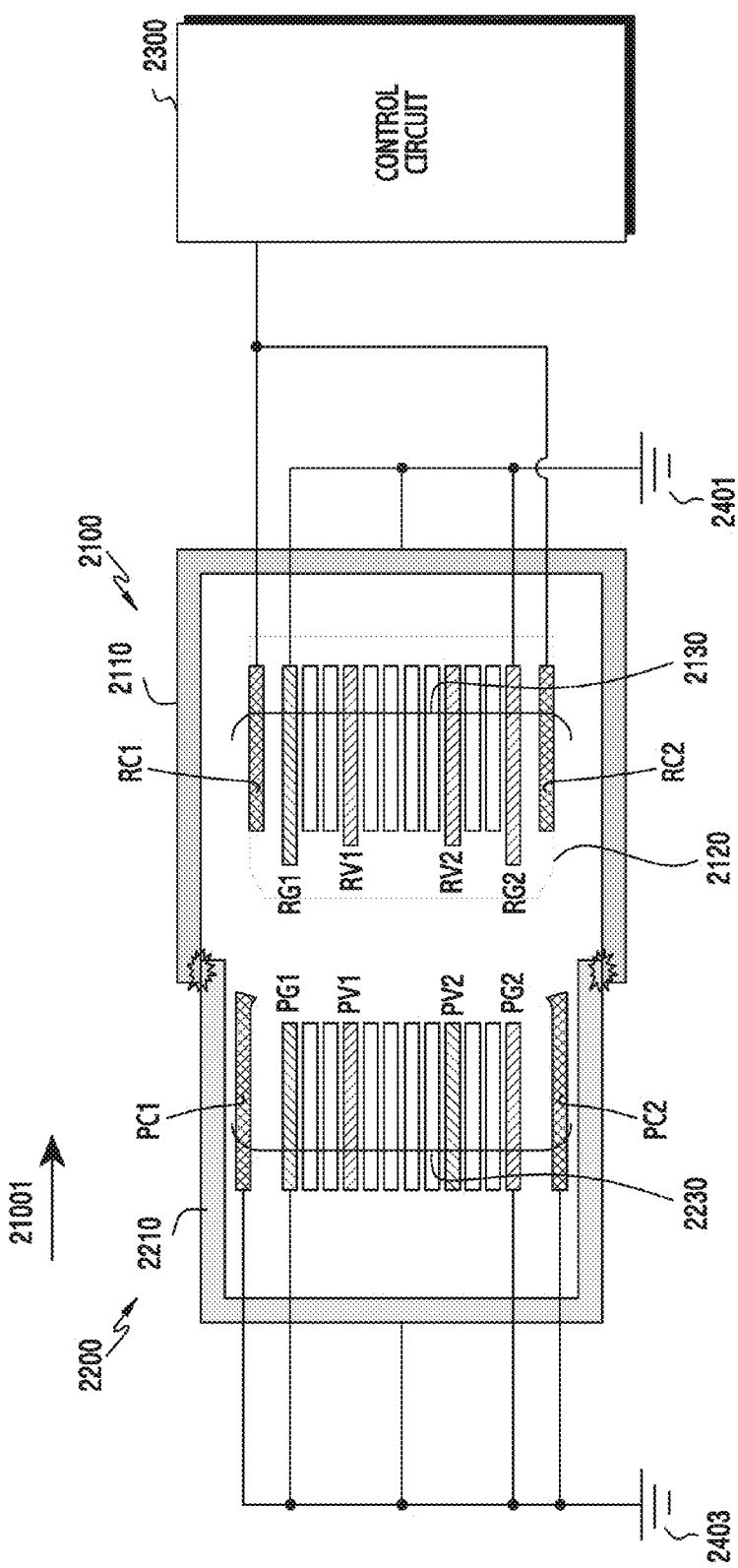
FIGS. 21 to 24 illustrate connection structures between a receptacle and a plug, and circuits thereof according to various embodiments of the present disclosure.

Referring to FIG. 21, according to an embodiment of the present disclosure, a receptacle 2100 may include a shell 2110, a tongue 2120, and a plurality of contacts 2130. The shell 2110, the tongue 2120, and the plurality of contacts 2130 are at least partially similar to the shell 810, the tongue 820, and the plurality of contacts 830 of FIGS. 8 to 13, respectively, and detailed descriptions thereof will be omitted. For example, the plurality of contacts 2130 of the receptacle 2100 may include C contacts RC1 and RC2, ground contacts RG1 and RG2, contacts RV1 and RV2 that support power supply (hereinafter, power contacts), and other contacts (e.g., a contact that supports high speed transmission of digital data, a CC contact, an SBU contact, and a contact that supports low speed data transmission).

According to an embodiment of the present disclosure, the C contacts RC1 and RC2 and the ground contacts RG1 and RG2 of the receptacle 2100 may be electrically connected to a ground member 2401 (e.g., a PCB ground).

According to an embodiment of the present disclosure, the C contacts RC1 and RC2 of the receptacle 2100 may be included in the conductive portion of the mid-plate (e.g., the mid-plate 8202 of FIG. 9) included in the tongue 2120. For example, the C contacts RC1 and RC2 of the receptacle 2100 may include a hook fastening portion (e.g., the hook fastening portion 42031 of FIG. 5) that is capable of being fastened to the hook (e.g., the hook 5203 of FIG. 5) formed on the C contacts (PC1 and PC2) of a plug 2200.

According to an embodiment of the present disclosure, a control circuit 2300 may be electrically connected to the receptacle 2100, and may detect an electric connection between the mid-plate 2120 of the receptacle 2100 and the plug 2200 through pull-up, pull-down, or the like. The control circuit 2300 may execute various operation flows depending on whether the mid-plate 2120 of the receptacle 2100 and the plug 2200 are electrically connected to each other. The control circuit 2300 is at least partially similar to the control circuit 403 of FIG. 5, and detailed descriptions thereof will be omitted.

According to an embodiment of the present disclosure, the plug 2200 may include a shell 2210 and a plurality of contacts 2230. The shell 2110 and the contacts 2230 are at least partially similar to the shell 810 and the contacts 1430 of FIGS. 14 to 15, respectively, and detailed descriptions thereof will be omitted. For example, the plurality of contacts 2230 of the plug 2200 may include C contacts PC1 and PC2, ground contacts PG1 and PG2, contacts PV1 and PV2 that support power supply (hereinafter, power contacts), and other contacts (e.g., a contact that supports high speed transmission of digital data, a CC contact, an SBU contact, and a contact that supports low speed data transmission).

According to an embodiment of the present disclosure, the C contacts PC1 and PC2 and the ground contacts PG1 and PG2 of the plug 2200 may be electrically connected to a ground member 2403.

According to an embodiment of the present disclosure, the C contacts PC1 and PC2 of the plug 2200 may have a shape of a pin (e.g., the extension 520 of FIG. 5) extending in an insertion direction 21001 of the plug 2200. Each of the C contacts PC1 and PC2 of the plug 2200 is similar to a cantilever, and may include a hook at the free end thereof.

According to an embodiment of the present disclosure, the shell 2110 of the receptacle 2100 may be electrically connected to a ground member 2401 (e.g., a PCB ground). In addition, the shell 2210 of the plug 2200 may be electrically connected to a ground member 2403.

Referring to FIG. 21, when the plug 2200 is inserted into a first position of the receptacle 2100, the shell 2110 of the receptacle 2100 may be electrically connected to the shell 2210 of the plug 2200, and the plurality of contacts 2130 of the receptacle 2100 may not be electrically connected to the plurality of contacts 2300 of the plug 2200. According to various embodiments of the present disclosure, at least one of the shell 2110 of the receptacle 2100 and the shell 2210 of the plug 2200 may include an elastic portion (not illustrated) in a bent form. When the receptacle 2100 and the plug 2200 are coupled to each other, the elastic portions may reduce poor contact between the shell 2110 of the receptacle 2100 and the shell 2210 of the plug 2200.

According to an embodiment of the present disclosure, when the plug 2200 moves into the receptacle 2100, the shell 2110 of the receptacle 2100 may be electrically connected to the plug 2200 earlier than at least some of the plurality of contacts 2130 of the receptacle 2100. Such a connection state can prevent a harmful component (e.g., noise), which may be generated before the contacts 2130 and 2230 of the receptacle 2100 and the plug 2200 are connected to each other, from interfering with an electronic device (e.g., the electronic device 401 of FIG. 4) that is equipped with the receptacle 2100, the control circuit 2300, and the like. For example, assuming that the C contacts RC1 and RC2 of the receptacle 2100 are electrically connected to the plug 2200 earlier than the shell 2100, a harmful component (e.g., an overcurrent, an overvoltage, an overpower, a momentary pulse, or noise) may enter into the control circuit 2300 (hereinafter, referred to as an "external connector detector") that executes various operation flows by using the C contacts PC1 and PC2 of the receptacle 2100. If the shell 2110 of the receptacle 2100 is designed to be electrically conducted to the plug 2200 earlier than the C contacts RC1 and RC2 when the plug 2200 is inserted into the receptacle 2100, it is possible to reduce the interference of a harmful component to the external connector detector.

Figure 22:
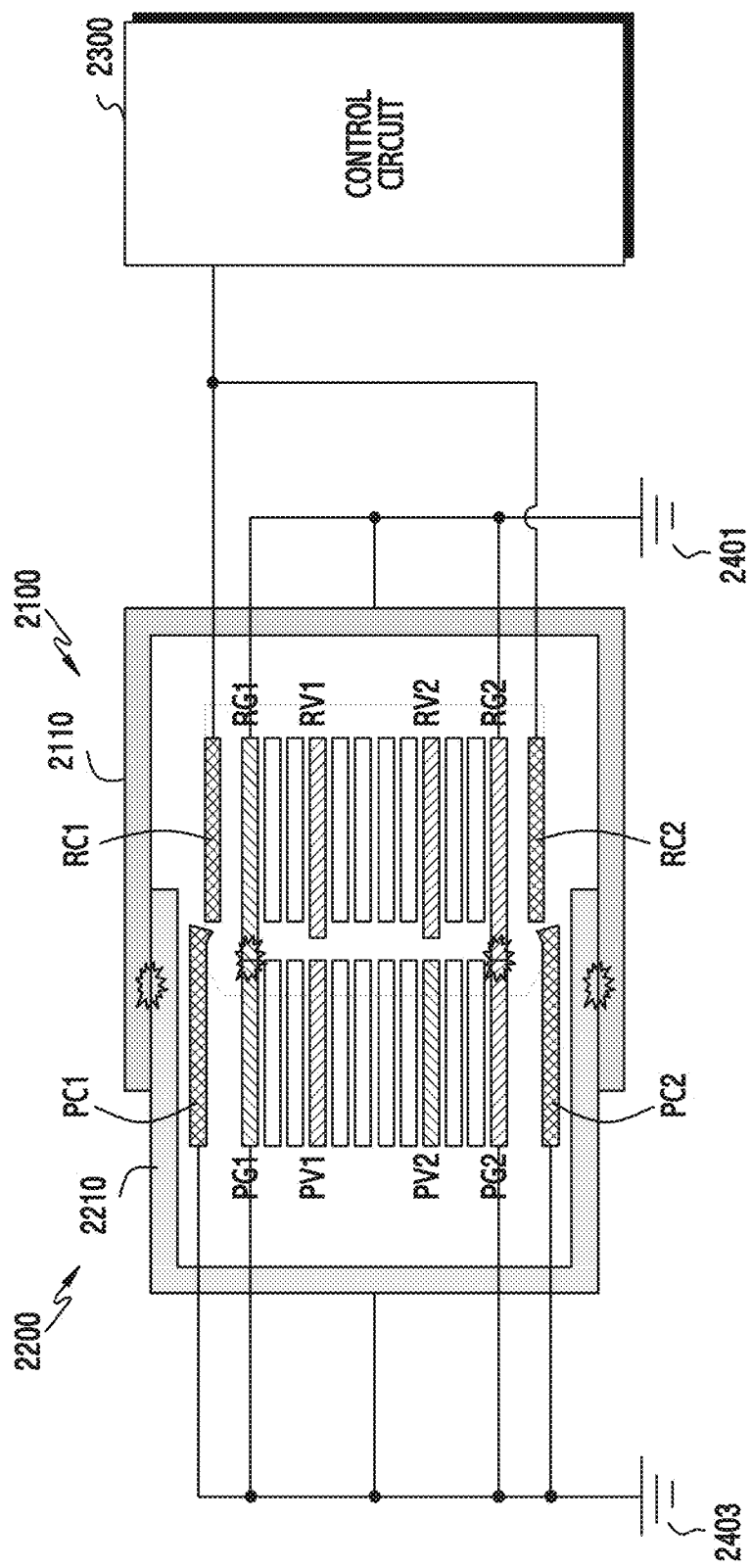

Referring to FIG. 22, when the plug 2200 is inserted into a second position of the receptacle 2100 in the state where the shell 2110 of the receptacle 2100 is electrically connected to the plug 2200, the ground contacts RG1 and RG2 of the receptacle 2100 may be additionally electrically conducted to the ground contacts PG1 and PG2 of the plug 2200. Or, when the plug 2200 is inserted into the second position of the receptacle 2100, the other contacts of the receptacle 2100 may not be electrically connected to the plug 2200. When the plug 2200 moves into the receptacle 2100, the shell 2110 of the receptacle 2100 and the ground contacts RG1 and RG2 may be electrically connected to the plug 2200 earlier. Such a connection state can prevent a harmful component, which may be generated before the other contacts of the receptacle 2100 and the plug 2200 are connected to each other, from interfering with an electronic device that is equipped with the receptacle 2100, the control circuit 2300, and the like. For example, assuming that the C contacts RC1 and RC2 of the receptacle 2100 are electrically connected to the plug 2200 earlier than the shell 2110 or the ground contacts RG1 and RG2, a harmful component may enter into the external connector detector. If the shell 2110 and the ground contacts RG1 and RG2 of the receptacle 2100 are designed to be electrically conducted to the plug 2200 earlier than the C contacts RC1 and RC2 when the plug 2200 is inserted into the receptacle 2100, it is possible to reduce the interference of a harmful component to the external connector detector.

Figure 23:
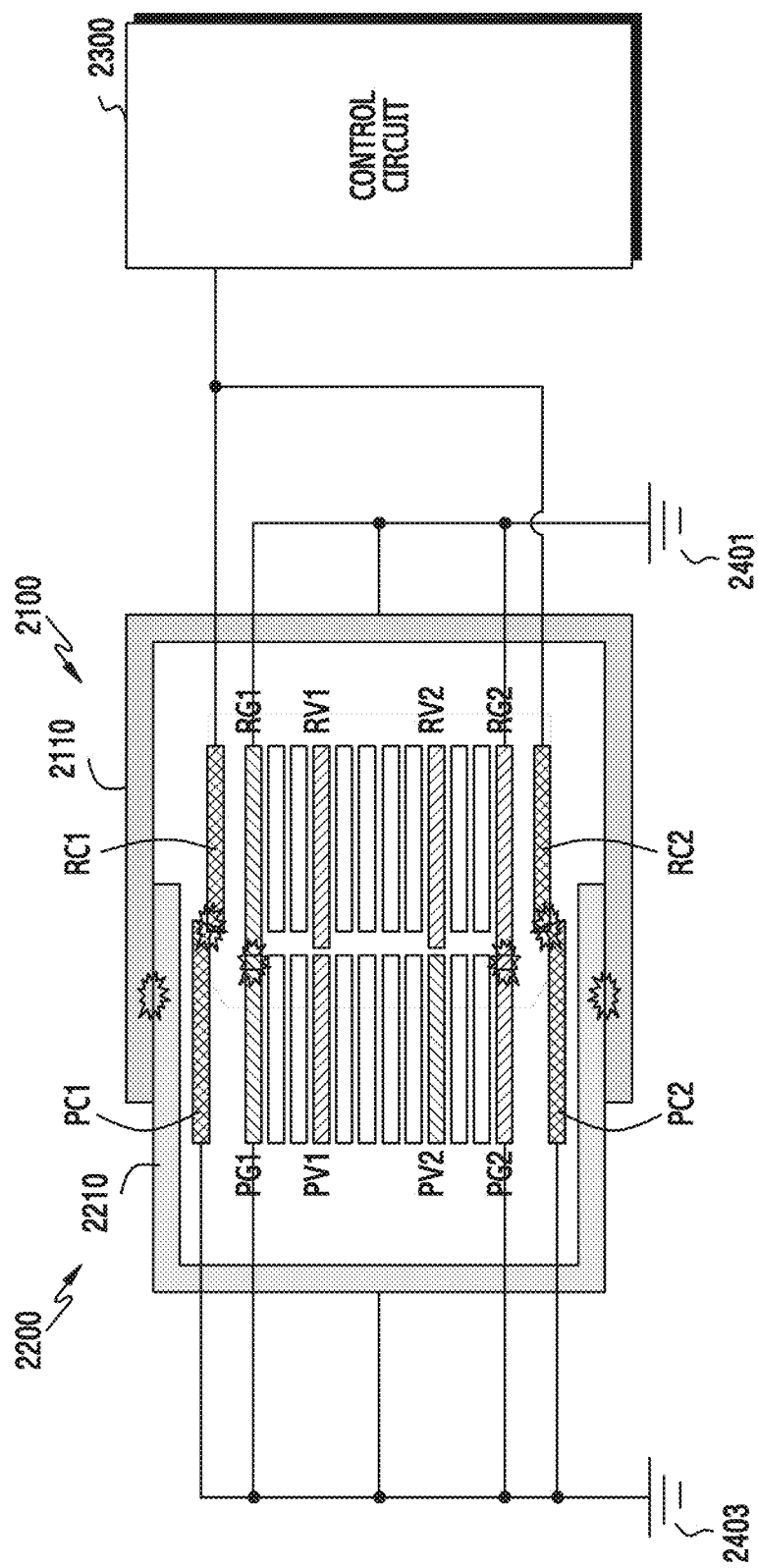

Referring to FIG. 23, when the plug 2200 is inserted into a third position of the receptacle 2100 in the state where the shell 2110 and the ground contacts RG1 and RG2 of the receptacle 2100 is electrically connected to the plug 2200, the C contacts RC1 and RC2 of the receptacle 2100 may be additionally electrically conducted to the C contacts PC1 and PC2 of the plug 2200. Alternatively, when the plug 2200 is inserted into the third position of the receptacle 2100, the power contacts RV1 and RV2 of the receptacle 2100 may not be electrically connected to the plug 2200. For example, assuming that the power contacts RV1 and RV2 of the receptacle 2100 are electrically connected to the plug 2200 earlier than the shell 2110 or the ground contacts RG1 and RG2, a harmful component, which interferes with the external connector detector, may be generated by the power flow between the power contacts RV1 and RV2 of the receptacle 2100 and the power contacts PV1 and PV2 of the plug 2200. If the shell 2110 and the ground contacts RG1 and RG2 of the receptacle 2100 are designed to be electrically conducted to the plug 2200 earlier than the power contacts PV1 and PV2 when the plug 2200 is inserted into the receptacle 2100, it is possible to reduce the interference of a harmful component to the external connector detector.

Figure 24:
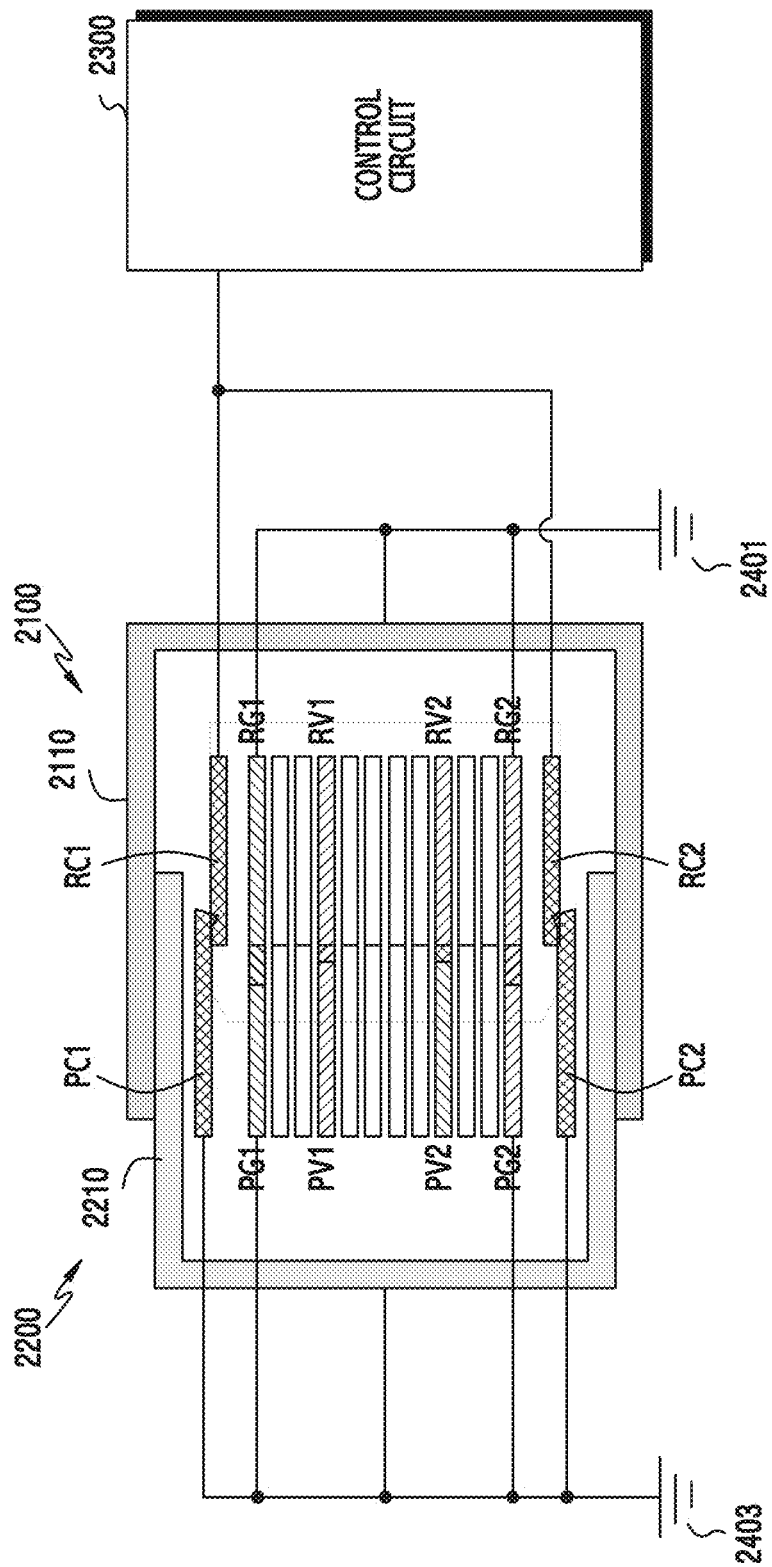

FIG. 24 illustrates a state in which a receptacle and a plug are completely coupled to each other according to various embodiments of the present disclosure.

Referring to FIGS. 23 and 24, in the state where the shell 2110, the ground contacts RG1 and RG2, the C contacts RC1 and RC2, and the power contacts RV1 and RV2 of the receptacle 2100 are electrically connected to the plug 2200, the shell 2110 and/or the ground contacts RG1 and RG2 of the receptacle 2100 may be electrically separated from the plug 2200 unintentionally due to the deterioration, the fracture, or the like of the receptacle 2100 and/or the plug 2200. In such a case, a harmful component may enter into the external connector detector. According to an embodiment of the present disclosure, the control circuit 2330 may include a malfunction prevention circuit. The malfunction prevention circuit can prevent the malfunction of the external connector detector, which may be caused by a harmful component, such as an overcurrent, an overvoltage, a momentary pulse, or noise. The malfunction prevention circuit may include various types of R-C circuits, L-C circuits, or R-L-C circuits.

According to an embodiment of the present disclosure, an electronic device may include a receptacle configured to be connected with an external connector, and may further include a ground member and a control circuit that are electrically connected to the receptacle. The receptacle may include a shell configured to accommodate the external connector, a tongue disposed in a space of the shell and enclosed by the shell, and at least one first contact disposed on the tongue and electrically connected to the ground member. The receptacle may include at least one second contact that is coupled to the tongue and electrically connected to the control circuit. The receptacle may include at least one third contact disposed on the tongue and electrically connected to a conductive member included in the tongue and the control circuit. The first contact may have a length extending more than the third contact in a direction where the external connector is separated from the receptacle. According to an embodiment of the present disclosure, the first contact may be electrically conducted to the external connector earlier than the third contact when the external connector is inserted into the receptacle.

According to an embodiment of the present disclosure, when the external connector is inserted into the receptacle, a point where the external connector is initially electrically conducted to the third contact may be positioned farther than a point where the external connector is initially electrically conducted to the first contact in the insertion direction of the external connector.

According to an embodiment of the present disclosure, an electric conduction point with the external connector is formed at, or in the vicinity of, an end of the first contact, the second contact, and/or the third contact.

According to an embodiment of the present disclosure, in the electronic device, the third contact may be formed by at least a portion of the conductive member.

According to an embodiment of the present disclosure, the first contact may have a length that extends more than the second contact in a direction where the external connector is separated from the receptacle. According to an embodiment of the present disclosure, the first contact may be electrically conducted to the external connector earlier than the second contact when the external connector is inserted into the receptacle.

According to an embodiment of the present disclosure, when the external connector is inserted into the receptacle, a point where the external connector is initially electrically conducted to the second contact may be positioned farther than a point where the external connector is initially electrically conducted to the first contact in the insertion direction of the external connector.

According to an embodiment of the present disclosure, the second contact may include a contact configured to supply power.

According to an embodiment of the present disclosure, the second contact may include a contact to be used for identifying an external device connected to the external connector.

According to an embodiment of the present disclosure, the first and second contacts may be disposed between a pair of third contacts when viewed in a plan view.

According to an embodiment of the present disclosure, when the shell is electrically connected to the ground member and the external connector is inserted into the receptacle, the shell may be electrically conducted to the external connector first.

According to an embodiment of the present disclosure, the tongue may include a non-conductive member that wraps at least a portion of the conductive member.

According to an embodiment of the present disclosure, the tongue may include a non-conductive first plate on which the first and second contacts are arranged and a second plate coupled to the first plate and including the conductive member.

According to an embodiment of the present disclosure, the first plate may include a plurality of layers, and at least a portion of the second plate may be disposed among the plurality of layers.

According to an embodiment of the present disclosure, the second plate further includes a non-conductive member, and the conductive member may be disposed farther than the non-conductive member in a direction where the external connector is inserted.

According to an embodiment of the present disclosure, the conductive member may include a first conductive member and a second conductive member that are arranged in a direction that intersects a direction where the external connector is inserted. The second plate may further include a non-conductive or conductive third member that includes a portion extending between the first conductive member and the second conductive member.

According to an embodiment of the present disclosure, the external connector may include at least one hook configured to be fastened to the receptacle when the external connector is inserted into the receptacle. The receptacle may further include a hook fastening portion to cause the hook to be fastened, and the third contact may be formed on the hook fastening portion.

According to an embodiment of the present disclosure, the tongue may include a first face and a second face that face in the opposite directions, and may include a third face that encloses a space between the first face and the second face. The first and second contacts may be disposed on at least one of the first and second faces, and the third contact may be disposed on the third face.

According to an embodiment of the present disclosure, the control circuit may determine whether the receptacle and the external connector are coupled to each other based on whether electricity is conducted between the third contact and the external connector.

According to an embodiment of the present disclosure, the control circuit may selectively activate the second contact based on whether electricity is conducted between the third contact and the external connector.

According to an embodiment of the present disclosure, the receptacle may be a C-type connector.

According to an embodiment of the present disclosure, the ground member may include a ground of a PCB embedded in the electronic device.

According to an embodiment of the present disclosure, a system may include a first connector electrically connected to a first device and including a plurality of first contacts, and a second connector electrically connected to a second device and including a plurality of second contacts. The system may include a conductive first fastening unit formed on the first connector for physical fastening with the second connector, and a conductive second fastening unit formed on the second connector for physical fastening with the first connector. At least one of the plurality of first contacts may include at least one first ground contact electrically connected to a ground member embedded in the first device. At least one of the plurality of second contacts may include at least one second ground contact electrically connected to a ground member embedded in the second device. When the first connector and the second connector are coupled to each other, electric conduction between the first ground contact and the second ground contact may precede before electric conduction between the first fastening unit and the second fastening unit.

Certain aspects of the present disclosure can also be embodied as computer readable code on a non-transitory computer readable recording medium. A non-transitory computer readable recording medium is any data storage device that can store data which can be thereafter read by a computer system. Examples of the non-transitory computer readable recording medium include a Read-Only Memory (ROM), a Random-Access Memory (RAM), Compact Disc-ROMs (CD-ROMs), magnetic tapes, floppy disks, and optical data storage devices. The non-transitory computer readable recording medium can also be distributed over network coupled computer systems so that the computer readable code is stored and executed in a distributed fashion. In addition, functional programs, code, and code segments for accomplishing the present disclosure can be easily construed by programmers skilled in the art to which the present disclosure pertains.

At this point it should be noted that the various embodiments of the present disclosure as described above typically involve the processing of input data and the generation of output data to some extent. This input data processing and output data generation may be implemented in hardware or software in combination with hardware. For example, specific electronic components may be employed in a mobile device or similar or related circuitry for implementing the functions associated with the various embodiments of the present disclosure as described above. Alternatively, one or more processors operating in accordance with stored instructions may implement the functions associated with the various embodiments of the present disclosure as described above. If such is the case, it is within the scope of the present disclosure that such instructions may be stored on one or more non-transitory processor readable mediums. Examples of the processor readable mediums include a ROM, a RAM, CD-ROMs, magnetic tapes, floppy disks, and optical data storage devices. The processor readable mediums can also be distributed over network coupled computer systems so that the instructions are stored and executed in a distributed fashion. In addition, functional computer programs, instructions, and instruction segments for accomplishing the present disclosure can be easily construed by programmers skilled in the art to which the present disclosure pertains.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a receptacle configured to be connected with an external connector; and
   a ground member and a control circuit that are electrically connected to the receptacle,
   wherein the receptacle comprises:
     a shell configured to accommodate the external connector;
     a tongue disposed in a space of the shell and enclosed by the shell;
     at least one first contact disposed on the tongue and electrically connected to the ground member;
     at least one second contact disposed on the tongue and electrically connected to the control circuit; and
     at least one third contact disposed on the tongue and electrically connected to a conductive member included in the tongue and the control circuit, and
   wherein the at least one first contact has a length extending more than the third contact in a direction where the external connector is separated from the receptacle.

2. The electronic device of claim 1, wherein an electric conduction point with the external connector is formed at or in a vicinity of an end of the at least one first contact, the at least one second contact, and/or the third contact.

3. The electronic device of claim 1, wherein the third contact is formed by at least a portion of the conductive member.

4. The electronic device of claim 1, wherein the at least one first contact has a length extending more than the at least one second contact in a direction where the external connector is separated from the receptacle.

5. The electronic device of claim 4, wherein the at least one second contact comprises a contact configured to supply power.

6. The electronic device of claim 4, wherein the at least one second contact comprises a contact to be used for identifying an external device connected to the external connector.

7. The electronic device of claim 1, wherein the at least one first contact and the at least one second contact are disposed between a pair of third contacts when viewed in a plan view.

8. The electronic device of claim 1, wherein, when the shell is electrically connected to the ground member and the external connector is inserted into the receptacle, the shell is electrically conducted to the external connector first.

9. The electronic device of claim 1, wherein the tongue comprises a non-conductive member that wraps at least a portion of the conductive member.

10. The electronic device of claim 1, wherein the tongue comprises:
    a non-conductive first plate on which the at least one first and the at least one second contact are arranged; and
    a second plate coupled to the non-conductive first plate and including the conductive member.

11. The electronic device of claim 10,
    wherein the non-conductive first plate comprises a plurality of layers, and
    wherein at least a portion of the second plate is disposed among the plurality of layers.

12. The electronic device of claim 10,
    wherein the second plate further comprises a non-conductive member, and
    wherein the conductive member is disposed farther than the non-conductive member in a direction where the external connector is inserted.

13. The electronic device of claim 10,
    wherein the conductive member comprises a first conductive member and a second conductive member that are arranged in a direction that intersects a direction where the external connector is inserted, and
    wherein the second plate further comprises a non-conductive or conductive third member that includes a portion extending between the first conductive member and the second conductive member.

14. The electronic device of claim 1,
    wherein the external connector comprises at least one hook configured to be fastened to the receptacle when the external connector is inserted into the receptacle,
    wherein the receptacle further comprises a hook fastening portion to cause the hook to be fastened, and
    wherein the third contact is formed on the hook fastening portion.

15. The electronic device of claim 1,
    wherein the tongue comprises first and second faces that face in opposite directions and a third face that encloses a space between the first face and the second face,
    wherein the first and second contacts are disposed on at least one of the first and second faces, and
    wherein the third contact is disposed on the third face.

16. The electronic device of claim 1, wherein the control circuit is configured to determine whether the receptacle and the external connector are coupled to each other based on whether electricity is conducted between the third contact and the external connector.

17. The electronic device of claim 1, wherein the control circuit is configured to selectively activate the second contact based on whether electricity is conducted between the third contact and the external connector.

18. The electronic device of claim 1, wherein the receptacle is a USB Type-C connector.

19. The electronic device of claim 1, wherein the ground member comprises a ground of a printed circuit board (PCB) embedded in the electronic device.

* * * * *